United States Patent
Oshio et al.

(10) Patent No.: US 12,349,522 B2
(45) Date of Patent: Jul. 1, 2025

(54) LIGHT EMITTING DEVICE AND ELECTRONIC INSTRUMENT USING THE SAME

(71) Applicant: Panasonic Intellectual Property Management Co., Ltd., Osaka (JP)

(72) Inventors: Shozo Oshio, Osaka (JP); Mitsuru Nitta, Kyoto (JP); Ryosuke Shigitani, Osaka (JP); Chigusa Fujiwara, Osaka (JP); Shunpei Fujii, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 478 days.

(21) Appl. No.: 17/924,395

(22) PCT Filed: May 11, 2021

(86) PCT No.: PCT/JP2021/017795
§ 371 (c)(1),
(2) Date: Nov. 10, 2022

(87) PCT Pub. No.: WO2021/230221
PCT Pub. Date: Nov. 18, 2021

(65) Prior Publication Data
US 2023/0343905 A1    Oct. 26, 2023

(30) Foreign Application Priority Data

May 13, 2020  (JP) .................................. 2020-084496
Feb. 2, 2021  (JP) .................................. 2021-014818

(51) Int. Cl.
*H10H 20/851*    (2025.01)
(52) U.S. Cl.
CPC .... *H10H 20/8515* (2025.01); *H10H 20/8513* (2025.01)

(58) Field of Classification Search
CPC ........... C09K 11/7769; H10H 20/8513; H10H 20/8515
See application file for complete search history.

(56) References Cited

U.S. PATENT DOCUMENTS

2011/0102706 A1    5/2011   Oshio
2011/0309390 A1*  12/2011   Liu ..................... H01L 25/0753
                                                           257/89
(Continued)

FOREIGN PATENT DOCUMENTS

CN    108630794 A    10/2018
JP    2006-332288 A  12/2006
(Continued)

OTHER PUBLICATIONS

International Search Report for corresponding Application No. PCT/JP2021/017795, mailed Jun. 29, 2021.
(Continued)

*Primary Examiner* — Matthew C Landau
*Assistant Examiner* — Dmitriy Yemelyanov
(74) *Attorney, Agent, or Firm* — Renner, Otto, Boisselle & Sklar, LLP

(57) ABSTRACT

A light emitting device includes: a first light emitting element that emits a first light component; a second light emitting element that emits a second light component; a first phosphor that emits a third light component; and a second phosphor that emits a fourth light component. A spectral distribution of the output light has a trough portion within a wavelength range of 650 nm or more and 750 nm or less, and a minimum intensity value within the wavelength range is less than 30% of a maximum intensity value within a wavelength range of 380 nm or more and 2500 nm or less.

13 Claims, 10 Drawing Sheets

(56) References Cited

U.S. PATENT DOCUMENTS

| | | | |
|---|---|---|---|
| 2014/0167599 A1* | 6/2014 | Sugiura | H10H 20/8513 313/498 |
| 2015/0055337 A1 | 2/2015 | Lin et al. | |
| 2015/0233536 A1* | 8/2015 | Krames | F21K 9/232 362/84 |
| 2018/0358514 A1 | 12/2018 | Tragl et al. | |
| 2019/0088832 A1 | 3/2019 | Onuma et al. | |

FOREIGN PATENT DOCUMENTS

| | | |
|---|---|---|
| JP | 2007-134606 A | 5/2007 |
| JP | 2015-041769 A | 3/2015 |
| JP | 2018-518046 A | 7/2018 |
| JP | 6570653 B2 | 9/2019 |
| WO | 2010/053341 A1 | 5/2010 |
| WO | 2017/164214 A1 | 9/2017 |

OTHER PUBLICATIONS

Written Opinion for corresponding Application No. PCT/JP2021/017795, mailed Jun. 29, 2021.

Xu, Jian, UEDA, Junpei and Tanabe, Setsuhisa, Toward tunable and bright deep-red persistent luminescence of Cr3+ in garnets, Journal of the American Ceramic Society, Apr. 24, 2017, vol. 100, 4033-4044.

Extended European Search Report for European Application No. 21803314.0, issued Oct. 9, 2023.

* cited by examiner

LIGHT EMITTING DEVICE AND ELECTRONIC INSTRUMENT USING THE SAME

TECHNICAL FIELD

The present invention relates to a light emitting device and an electronic instrument using the same.

BACKGROUND ART

Heretofore, a light emitting device has been known, which is composed by combining a light emitting element and a phosphor with each other, and emits output light including a near-infrared light component (see Patent Literature 1).

The light emitting device of Patent Literature 1 is composed by including: a wavelength converter including a phosphor that uses $Cr^{3+}$ and/or $Ni^{2+}$ as a light emission center; and a semiconductor chip that emits excitation light. Then, the light emitting device performs wavelength conversion for blue light or red light, which is emitted by the semiconductor chip, by the wavelength converter, thereby generating near-infrared light. Note that an example of Patent Literature 1 also mentions performance of the light emitting device (optoelectronic element), in which an output of near-infrared light is less than 50 mW.

CITATION LIST

Patent Literature

Patent Literature 1: Japanese Patent No. 6570653

SUMMARY OF INVENTION

Such a conventional light emitting device, which is composed by combining the light emitting element and the phosphor with each other and emits the near-infrared light component, is sometimes combined with a detector that detects a wavelength region of near-infrared rays. At this time, the light emitting device emits output light with a spectral distribution that is necessary for the detector to ensure good sensitivity. That is, the conventional light emitting device disregards the fact that an inspection object looks visibly light to a human eye, and emits output light that focuses on the fact that the inspection object is detected with good sensitivity by the detector.

Accordingly, for example, in the case of inspecting the inspection object while checking the same by a human eye, when the conventional light emitting device that emits a near-infrared light component is used, the inspection object sometimes becomes hard to see, or sometimes appears to give a feeling of discomfort. Moreover, the conventional light emitting device does not sufficiently consider separation of visible light and near-infrared rays, either. Therefore, an optical filter is required in order to improve a signal/noise ratio (S/N ratio) of the detector that senses near-infrared rays, and therefore, a device configuration becomes sometimes complicated.

The present invention has been made in consideration of such problems as described above, which are inherent in the prior art. Then, it is an object of the present invention to provide a light emitting device that emits output light enabling good inspection for an inspection object not only by using a detector of near-infrared rays but also by visual observation in the case of being used in combination with the detector, and to provide an electronic instrument that uses the light emitting device.

In order to solve the above-described problems, a light emitting device according to a first aspect of the present invention is a light emitting device that emits output light, including: a first light emitting element that emits a first light component; a second light emitting element that is different from the first light emitting element and emits a second light component; a first phosphor that emits a third light component; and a second phosphor that is different from the first phosphor and emits a fourth light component. The output light includes the first light component, the second light component, the third light component and the fourth light component, which are different in color tone from one another. Each of the first light component and the second light component is a visible light component that has a maximum intensity value within a wavelength range of 380 nm or more and less than 700 nm. The third light component is a visible light component that is derived from first wavelength-converted light emitted by the first phosphor and has a maximum intensity value within a wavelength range of 435 nm or more and less than 700 nm. The fourth light component is a near-infrared light component that is derived from second wavelength-converted light emitted by the second phosphor and has a maximum intensity value within a wavelength range of 700 nm or more and less than 2500 nm. A spectral distribution of the output light has a trough portion within a wavelength range of 650 nm or more and 750 nm or less. A minimum intensity value within the wavelength range of 650 nm or more and 750 nm or less is less than 30% of a maximum intensity value within a wavelength range of 380 nm or more and 2500 nm or less.

An electronic instrument according to a second aspect of the present invention includes the above-mentioned light emitting device.

DESCRIPTION OF EMBODIMENTS

Figure 1:
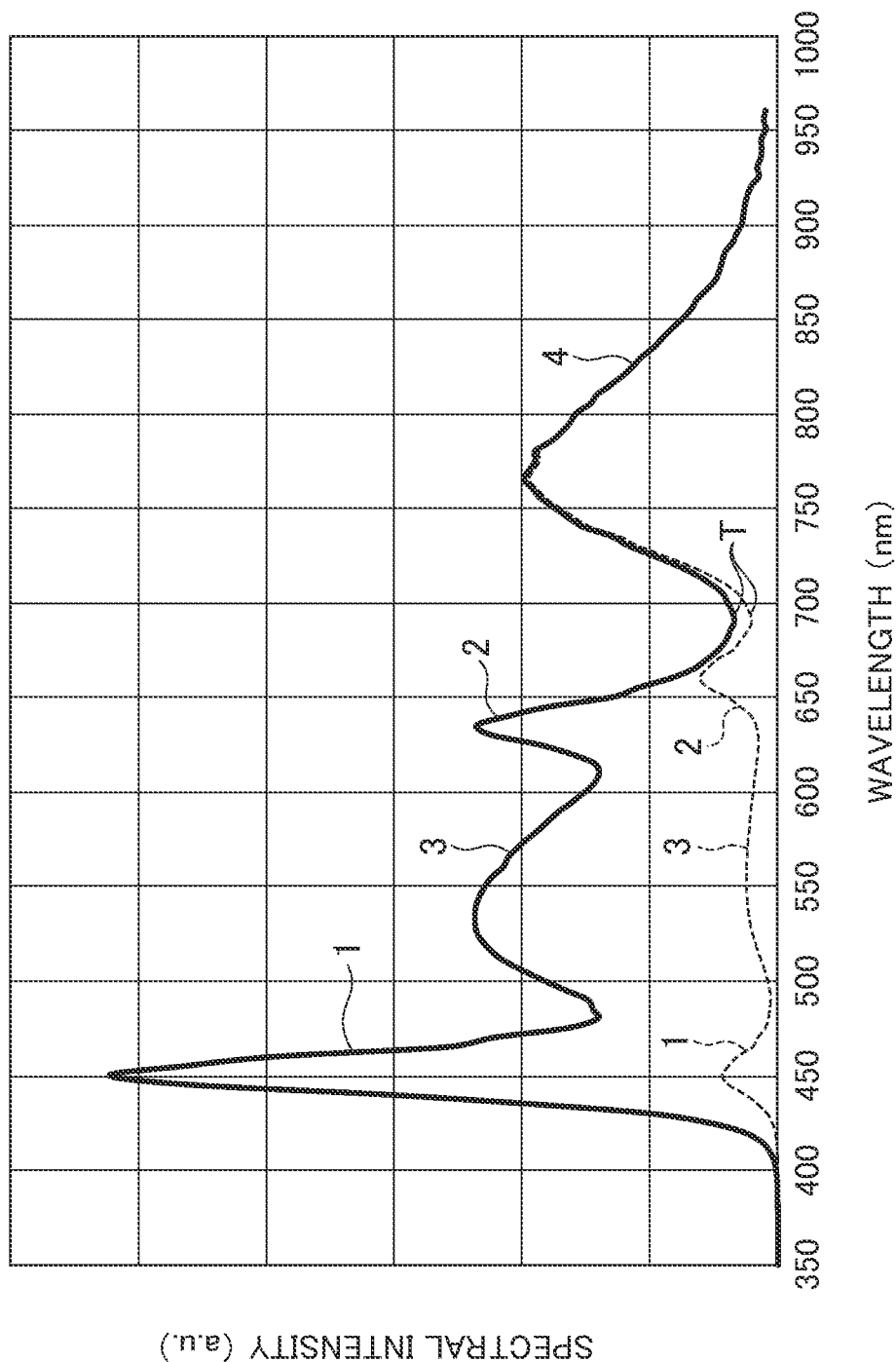
FIG. 1 is a graph illustrating an example of a spectral distribution of output light emitted from a light emitting device of a present embodiment.

A light emitting device of the present embodiment and an electronic instrument using the light emitting device will be described below with reference to the drawings. Note that any of embodiments to be described below illustrates a preferable specific example. Hence, numeric values, shapes, materials, constituents, arrangement positions and connection modes of the constituents, and the like, which are illustrated in the following embodiments, are merely examples, and are not intended to limit the present embodiment. Note that FIGS. 2 to 8 and FIG. 11 are schematic diagrams, and are not always strictly illustrated. Moreover, in FIGS. 2 to 8 and FIG. 11, the same reference numerals are assigned to the same constituents, and duplicate descriptions will be omitted or simplified.

FIG. 1 illustrates an example of a spectral distribution of output light emitted from a light emitting device of the present embodiment. FIGS. 2 to 6 schematically illustrate a configuration example of the light emitting device of the present embodiment. A light emitting device 10 of the present embodiment is a light emitting device that is composed by combining at least two types of light emitting elements 5 and 6 and at least two types of phosphors 7 and 8 with each other and emits output light 9.

[Output Light]

As illustrated in FIG. 1, the output light 9 emitted by the light emitting device of the present embodiment includes at least a first light component 1, a second light component 2, a third light component 3 and a fourth light component 4, which are different in color tone from one another.

The first light component 1 is a light component derived from light (primary light) emitted by the first light emitting element 5, and the second light component 2 is a light component derived from light (primary light) emitted by the second light emitting element 6. Each of these light components is a visible light component that has a maximum intensity value within a wavelength range of 380 nm or more and less than 700 nm, preferably, 435 nm or more and less than 670 nm.

The third light component 3 is a light component derived from first wavelength-converted light 3A emitted by a first phosphor 7, and is a visible light component that has a maximum intensity value within a wavelength range of 435 nm or more and less than 700 nm, preferably 500 nm or more and less than 600 nm.

The fourth light component 4 is near-infrared light that is derived from second wavelength-converted light 4A emitted by a second phosphor 8 and has a maximum intensity value within a wavelength range of 700 nm or more and less than 2500 nm, preferably 750 nm or more and less than 1800 nm. Note that an upper limit of the wavelength range, that is a longest wavelength may be 800 nm, 900 nm, 1000 nm, 1200 nm or 1500 nm.

The output light 9 as described above includes: visible light components visually recognizable by a human eye, that is, the first light component 1, the second light component 2 and the third light component 3; and a near-infrared light component hard to see by the human eye, that is, the fourth light component 4. Accordingly, use of the output light 9 makes it possible to perform a non-destructive inspection and the like for an inside of an illuminated object by near-infrared spectroscopy and the like while checking the illuminated object by the human eye.

Moreover, the light emitting device 10 emits the output light 9 that has a color tone obtained by additive color mixture of at least four types of light. That is, the output light 9 includes: the primary lights formed by conversion of electric power (that is, the first light component and the second light component, which are emitted by the light emitting elements); and the wavelength-converted lights formed by wavelength conversion of the primary light (that is, the first wavelength-converted light and the second wavelength-converted light, which are wavelength-converted by the first phosphor and the second phosphor). Accordingly, electric power supplied to the first light emitting element 5 and the second light emitting element 6 is controlled, whereby output intensities of the first light component 1 and the second light component 2 can be controlled independently of each other. Moreover, types of the first phosphor 7 and the second phosphor 8 are changed, whereby the color tones of the third light component 3 and the fourth light component 4 can also be controlled independently of each other.

As described above, the light emitting device 10 can easily meet a customer's demand regarding visibility of the illuminated object, the non-destructive inspection thereof, and the like, and can emit output light convenient for both of the human eye and the detector.

The spectral distribution of the output light 9 has a trough portion T within a wavelength range of 650 nm or more and 750 nm or less. Then, a minimum intensity value within the wavelength range of 650 nm or more and 750 nm or less is preferably less than 30% of a maximum intensity value within a wavelength range of 380 nm or more and 2500 nm or less, and particularly 380 nm or more and 960 nm or less. Moreover, the minimum intensity value is more preferably less than 20%, still more preferably less than 10% of the maximum intensity value within the wavelength range of 380 nm or more and 2500 nm or less, and particularly 380 nm or more and 960 nm or less. This way, a mixed light component of the first light component 1, the second light component 2 and the third light component 3, which are mainly composed of visible light components, and the fourth light component 4 that has a near-infrared light component less interfere with each other. That is, a spectral distribution is formed, in which the visible light components and the near-infrared light component are separated from each other to some extent in the vicinity of a wavelength of 700 nm taken as a boundary. Accordingly, in a detector that senses a near-infrared light component that transmits through or reflects on an object irradiated with the output light 9, it becomes possible to improve a signal/noise ratio (S/N ratio).

The spectral distribution as described above can be obtained in such a manner that a light component closest to a short wavelength side of the fourth light component 4 is emitted by the light emitting element (first light emitting element 5 or second light emitting element 6), and is formed into light with a narrow spectral full width at half maximum. From another viewpoint, the spectral distribution as described above can be obtained in such a manner that a light component located on a longest wavelength side within the wavelength range of 380 nm or more and less than 700 nm is emitted by the above-described light emitting element, and is formed into light with a narrow spectral full width at half maximum.

In a purpose of performing Fourier transform for a sensing signal and using the same after the sensing signal is obtained by sensing the near-infrared light component by the detector (for example, the purpose is optical coherence tomography imaging), and the like, preferably, the spectral distribution of the fourth light component 4 has unimodality. Moreover, the spectral distribution of the fourth light component 4 more preferably has a normal distribution or a spectral distribution approximate thereto. Then, at this time, in the spectral distribution of the fourth light component 4, intensity preferably does not suddenly change depending on wavelength in a wavelength region exceeding 700 nm. Specifically, in the wavelength region exceeding 700 nm, preferably, the intensity of the spectral distribution does not change beyond ±8%/nm, more preferably, does not change beyond ±3%/nm.

Note that numeric values which indicate an extent of the spectral distribution approximate to the normal distribution are as follows. In the fourth light component 4, a wavelength showing the maximum intensity value is defined as XP, and wavelengths on a short wavelength side and a long wavelength side, on each of which the intensity is a half of the maximum intensity value, are defined as $\lambda_S$ and $\lambda_L$, respectively. At this time, $\lambda_P$, $\lambda_S$ and $\lambda_L$ satisfy $1 \leq (\lambda_L - \lambda_P)/(\lambda_P - \lambda_S) < 2.0$, preferably $1 \leq (\lambda_L - \lambda_P)/(\lambda_P - \lambda_S) < 1.8$.

As described above, the spectral distribution of the fourth light component 4 has a normal distribution or a spectral distribution approximate thereto, whereby a false signal after the Fourier transform can be suppressed from being generated. Accordingly, it becomes possible to cause the detector to sense a sensing signal excellent in quality.

At least the first light component 1, the second light component 2 and the third light component 3 preferably has a light component of blue green through green and yellow to orange with a wavelength of 510 nm or more and less than 600 nm. Further, at least one of the first light component 1, the second light component 2 and the third light component 3 more preferably has a light component of green to yellow with a wavelength of 530 nm or more and less than 580 nm, still more preferably has a light component of green with a wavelength of 545 nm or more and less than 565 nm. Such a light component has strong intensity for the sensitivity of the human eye, and can look brighter. Accordingly, the light emitting device 10 is obtained, which emits the output light 9 that facilitates such an irradiated object to be visually recognized.

In the light emitting device 10, at least the first light component 1, the second light component 2 and the third light component 3 preferably has a light component of blue through blue green to green with a wavelength of 460 nm or more and less than 550 nm. Further, at least one of the first light component 1, the second light component 2 and the third light component 3 more preferably has a light component of blue green to green with a wavelength of 480 nm or more and less than 530 nm, still more preferably has a light component of blue green to green with a wavelength of 490 nm or more and less than 520 nm. In a situation of scotopic vision where a light quantity is small, such a light component has strong intensity for the sensitivity of the human eye, and can look brighter. Accordingly, such a light emitting device 10 is obtained, which emits the output light 9 that facilitates an object, which is illuminated in the darkness, to be visually recognized.

In the light emitting device 10, at least one of the first light component 1, the second light component 2 and the third light component 3 preferably has a light component with a wavelength of 610 nm or more and less than 670 nm, still more preferably has a light component of red with a wavelength of 630 nm or more and less than 660 nm. Such a light component has light that beautifully shows up or brightly shows up a skin color of the irradiated object and red. Accordingly, such a light emitting device 10 is obtained, which emits the output light 9 that improves appearances of irradiated human face and skin and appearances of reddish meats, fruits and the like.

Note that, when a wavelength of 850 nm is taken as a starting point, preferably, the intensity of the fourth light component 4 decreases as the wavelength becomes longer. Moreover, in the fourth light component 4, fluorescence intensity at a wavelength of 1000 nm can be caused to fall below 10% of fluorescence intensity at a wavelength of 850 nm. Moreover, the wavelength taken as a starting point is preferably shorter than 850 nm, and for example, can be set to 800 nm. Specifically, when the wavelength of 800 nm is taken as a starting point, the intensity of the fourth light component 4 preferably decreases as the wavelength becomes longer. Moreover, in the fourth light component 4, the fluorescence intensity at the wavelength of 1000 nm can be caused to fall below 10% of the fluorescence intensity at the wavelength of 800 nm, and the fluorescence intensity at a wavelength of 950 nm can also be caused to fall below 10% of the fluorescence intensity at the wavelength of 800 nm. In such a way, such output light 9 is obtained, in which a ratio of near-infrared or mid-infrared rays in the long wavelength region is small, the near-infrared or mid-infrared rays being easy to function as a heat ray. Accordingly, such a light emitting device 10 is obtained, which is advantageous for the purpose of inspecting objects, such as foods, prone to be adversely affected by heat.

In the fourth light component 4, a spectral full width at half maximum, that is, a wavelength difference between a long wavelength side and short wavelength side of a spectrum, in which the maximum intensity value of the fourth light component 4 is halved in intensity, preferably exceeds 70 nm, more preferably exceeds 100 nm. Thus, such output light 9 is obtained, which has near-infrared light components different in wavelength across a wide wavelength region. Accordingly, such a light emitting device 10 is obtained, which is advantageous for inspection, evaluation and the like for an object in which an absorption wavelength of near-infrared light is different or prone to fluctuate due to a surrounding environment.

Herein, the mixed light of the first light component 1, the second light component 2 and the third light component 3 preferably includes a blue light component, a blue green through green to yellow light component and a red light component. The blue light component is preferably a light component within a wavelength range of 435 nm or more and less than 480 nm, and is more preferably a light component that has a maximum intensity value within the wavelength range. The blue green through green to yellow light component is preferably a light component within a wavelength range of 500 nm or more and less than 580 nm, and is more preferably a light component that has a maximum intensity value within the wavelength range. The red light component is preferably a light component within a wavelength range of 600 nm or more and less than 700 nm, and is more preferably a light component that has a maximum intensity value within the wavelength range. Thus, the output light 9 includes blue, green and red light components which serve as three primary colors of light, and therefore, such a light emitting device 10 is obtained, which can output visible light with high color rendering properties. Moreover, such a light emitting device 10, which is advantageous for showing the irradiated object as it is, is obtained. Further, large quantities of the three primary colors of light and the near-infrared light component are emitted, and accordingly, such a light emitting device 10 is obtained, which has good adaptability to an imaging technology called RGB-NIR imaging.

The first light component 1 can be a blue light component that is derived from first primary light 1A emitted by the first light emitting element 5 and has a maximum intensity value within the wavelength range of 435 nm or more and less than 480 nm. Moreover, the first light component 1 is preferably a blue light component that has a maximum intensity value within a wavelength range of 440 nm or more and less than 470 nm. Such a first light component 1 can be obtained by using a conventional solid-state light emitting element such as a light emitting diode (LED) or a laser diode (LD), which emits blue light. Accordingly, such a light emitting device 10, which is advantageous for rapid product development and industrial production.

The second light component 2 can be a green to yellow light component that is derived from second primary light 2A emitted by the second light emitting element 6 and has a maximum intensity value within the wavelength range of 500 nm or more and less than 580 nm, preferably can be a green light component that is derived therefrom and has a maximum intensity value within a wavelength range of 510 nm or more and less than 560 nm. Moreover, the second light component 2 can be a red light component that is derived from the second primary light 2A emitted by the second light emitting element 6 and has a maximum intensity value within a wavelength range of 600 nm or more and less than 680 nm, preferably can be a light component that is derived therefrom and has a maximum intensity value within a wavelength range of 610 nm or more and less than 660 nm.

The third light component 3 can be a green through yellow and orange to red light component that is derived from first wavelength-converted light 3A emitted by the first phosphor 7 and has a maximum intensity value within a wavelength range of 500 nm or more and less than 700 nm. Moreover, the third light component 3 can be a green through yellow to orange light component that is derived from the first wavelength-converted light 3A emitted by the first phosphor 7 and has a maximum intensity value within the wavelength range of 500 nm or more and less than 600 nm. The third light component 3 can be a green light component that is derived from the first wavelength-converted light 3A emitted by the first phosphor 7 and has a maximum intensity value within a wavelength range of 520 nm or more and less than 560 nm.

When the second light component 2 and the third light component 3 are set as mentioned above, then in the output light 9, the first light component 1 emitted by the first light emitting element 5, the second light component 2 emitted by the second light emitting element 6, and the third light component 3 emitted by the first phosphor 7 form the three primary colors of light. Accordingly, the intensities and color tones of the respective light components are controlled, whereby the color tone of the output light 9 can be controlled in a wide chromaticity range, and such output light 9 with higher color rendering properties can be obtained.

Note that the second light component 2 is preferably a red light component that is derived from second primary light 2A emitted by the second light emitting element 6 and has a maximum intensity value within the wavelength range of 600 nm or more and less than 680 nm. Moreover, the second light component 2 is more preferably a red light component that is derived from second primary light 2A emitted by the second light emitting element 6 and has a maximum intensity value within the wavelength range of 610 nm or more and less than 660 nm. In such a way, for a light component that has a maximum intensity value within the wavelength range of red, a spectral full width at half maximum can be narrowed. Accordingly, such a light emitting device 10 is obtained, which easily achieves both of an output increase of the visible light component of the output light 9 and of an increase of color rendering properties thereof.

The fourth light component 4 is preferably light obtained by wavelength-converting the second light component 2 by the second phosphor 8, that is, preferably the second wavelength-converted light 4A. In such a way, an energy difference (Stokes shift) between light absorption and fluorescence emission by the second phosphor 8 can be reduced. Accordingly, a phenomenon (temperature quenching) can be suppressed, in which the second phosphor 8 generates heat by an energy loss caused following wavelength conversion from the visible light to the near-infrared light, and quenches by a temperature rise of the phosphor. Hence, such a light emitting device 10, which is advantageous for the output increase of the near-infrared light component, is obtained.

The third light component 3 is preferably light obtained by wavelength-converting the first light component 1 by the first phosphor 7, that is, preferably the first wavelength-converted light 3A. In such a way, an energy difference between light absorption and fluorescence emission by the first phosphor 7 can be reduced. Accordingly, a phenomenon can be suppressed, in which the first phosphor 7 generates heat by an energy loss caused following wavelength conversion from the visible light to visible light with a longer wavelength, and quenches by a temperature rise of the phosphor. Accordingly, such a light emitting device 10 is obtained, which can output the third light component 3 with high photon conversion efficiency.

In the output light 9, an integrated value of energy intensity of a light component with a wavelength of less than 700 nm can be made larger than an integrated value of energy intensity of a light component with a wavelength of 700 nm or more. Moreover, the integrated value of the energy intensity of the light component with the wavelength of less than 700 nm may be caused to exceed twice or three times the integrated value of the energy intensity of the light component with the wavelength of 700 nm or more. In such a way, the energy intensity of the visible light with a large luminosity factor becomes larger than the energy intensity of the light component including the near-infrared light with a small luminosity factor. Therefore, the irradiated object becomes bright and easy to see for the human eye, and further, it becomes possible to perform non-destructive inspection of the irradiated object according to needs.

Meanwhile, in the output light 9, the integrated value of the energy intensity of the light component with the wavelength of less than 700 nm can be made smaller than the integrated value of the energy intensity of the light component with the wavelength of 700 nm or more. Moreover, the integrated value of the energy intensity of the light component with the wavelength of less than 700 nm may be caused to fall below a half or one third of the integrated value of the energy intensity of the light component with the wavelength of 700 nm or more. In such a way, the energy intensity of the light component including the near-infrared light becomes larger than the energy intensity of the visible light. Accordingly, such output light 9 becomes suitable for a high-precision non-destructive inspection, a non-destructive inspection for minute objects, a wide-range non-destructive inspection, a non-destructive inspection for large objects or thick objects, and the like. Moreover, according to needs, it also becomes possible to check a surface state of the irradiated object, and the like easily by the human eye. Further, such output light 9 with a small output ratio of the visible light component is emitted, and therefore, a light emitting device advantageous for reducing glare of the output light 9 is also obtained.

In the light emitting device 10, the output light 9 can be one that exhibits white color. For example, preferably, the first light component 1, the second light component 2 and the third light component 3 are appropriately combined with one another to form the output light to white light by additive color mixture. In such a way, the light emitting device 10 will emit light similar in color tone to natural light and high-output near-infrared rays simultaneously with each other, and can serve as both general lighting and industrial lighting. Accordingly, the light emitting device 10 can be used for a sensing device that senses a state of the irradiated object under an environment where the irradiated object is irradiated in a nearly natural state, and for an inspection device that inspects an internal structure and defect of the irradiated object.

In the output light 9 of the light emitting device 10, which exhibits white color, an average color rendering index Ra preferably exceeds 80, more preferably exceeds 90. In such a way, by the light of the high color rendering properties, appearances of fruits and vegetables, meats, fresh fishes and the like can be filled with freshness. Meanwhile, the reflected light or transmitted light of the near-infrared light, which illuminates these objects, is detected, whereby degrees of damage, freshness and the like of the insides of the objects can be evaluated. Accordingly, for example, it becomes possible to grasp degrees of damage of fruits and vegetables, which are displayed in a selling space, without allowing a third party to perceive the damage, and possible to remove the fruits and vegetables early from the selling space when the damage thereof is recognized.

Moreover, by the light with high color rendering properties, human face and skin, human body's organs or the like can be shown beautifully. Meanwhile, the reflected light or transmitted light of the near-infrared light is detected, whereby human health condition, disease and the like can be evaluated. Further, by the light with high color rendering properties, animals and plants can be allowed to exhibit nearly natural aliveness. Meanwhile, by the near-infrared light, health states of the animals and the plants, conditions of injuries thereof, and the like can be evaluated. Moreover, after the irradiated object is turned by the light with high color rendering properties to a state equivalent to the case of being illuminated with natural light, the irradiated object can be monitored or measured by the near-infrared light without being perceived by persons.

The output light 9 that exhibits white color can have spectral intensity within at least a full wavelength range of 440 nm or more and less than 660 nm. Moreover, the output light 9 that exhibits white color can also have spectral intensity within at least a full wavelength range of 430 nm or more and less than 900 nm. That is, the output light 9 can be light with a spectral distribution free from a zero-intensity wavelength component within the above-described wavelength ranges. Such output light 9 can illuminate the object by many lights different in wavelength. Moreover, preferably, the output light 9 has spectral intensity across the entire region from the short-wavelength visible (purple blue) to the near-infrared. Thus, the output light 9 can be applied to hyperspectral imaging that images reflected lights of an illuminated object, which are different depending on illumination wavelengths, thereafter integrates the reflected lights, and visualizes a feature of the illuminated object.

Note that a solid line of FIG. 1 illustrates an example of a spectral distribution of such output light 9 in a light emitting device using the following ones as the first light emitting element 5, the second light emitting element 6, the first phosphor 7 and the second phosphor 8. As the first light emitting element 5, a blue light emitting diode is used, in which a peak wavelength of the first light component 1 is 450 nm. As the second light emitting element 6, a red light emitting diode is used, in which a peak wavelength of the second light component 2 is 635 nm. As the first phosphor 7, a $Ce^{3+}$-activated yttrium aluminum garnet-type phosphor is used, in which a fluorescence peak wavelength of the third light component 3 is 535 nm. As the second phosphor 8, a $Cr^{3+}$-activated gadolinium gallium garnet-type phosphor is used, in which a fluorescence peak wavelength of the fourth light component 4 is 765 nm.

As illustrated by the solid line of FIG. 1, the spectral distribution of the output light 9 has a trough portion T within the wavelength range of 650 nm to 750 nm, and the visible light component and the near-infrared light component are separated from each other at the trough portion T taken as a boundary. Moreover, the minimum intensity value within the wavelength range of 650 nm or more and 750 nm or less, that is, intensity at around a wavelength of 690 nm is less than 30% of the maximum intensity value within the wavelength range of 380 nm or more and 2500 nm or less, that is, intensity at around a wavelength of 450 nm.

Further, with regard to the spectral distribution illustrated by the solid line of FIG. 1, a correlated color temperature, duv (index indicating a deviation from blackbody radiation) and average color rendering index Ra thereof are 8115K, 0.6 and 93, respectively. As described above, since the duv stays within a range of ±1, the output light of the solid line of FIG. 1 can be said to have a light color close to that of natural light. Moreover, since Ra exceeds 90, the output light of the solid line of FIG. 1 is close to natural light and has high color rendering properties.

A broken line of FIG. 1 illustrates an example of a spectral distribution of such output light 9 in a light emitting device using the following ones as the first light emitting element 5, the second light emitting element 6, the first phosphor 7 and the second phosphor 8. As the first light emitting element 5, the blue light emitting diode is used, in which the peak wavelength of the first light component 1 is 450 nm. As the second light emitting element 6, a red light emitting diode is used, in which the peak wavelength of the second light component 2 is 660 nm. As the first phosphor 7, a $Ce^{3+}$-activated yttrium aluminum garnet-type phosphor is used, in which the fluorescence peak wavelength of the third light component 3 is 555 nm. As the second phosphor 8, the $Cr^{3+}$-activated gadolinium gallium garnet-type phosphor is used, in which the fluorescence peak wavelength of the fourth light component 4 is 765 nm.

As illustrated by the broken line of FIG. 1, the spectral distribution of the output light 9 has a trough portion T within the wavelength range of 650 nm to 750 nm, and the visible light component and the near-infrared light component are separated from each other at the trough portion T taken as a boundary. Moreover, the minimum intensity value within the wavelength range of 650 nm or more and 750 nm or less, that is, the intensity at around the wavelength of 690 nm is less than 30% of the maximum intensity value within the wavelength range of 380 nm or more and 2500 nm or less, that is, intensity at around a wavelength of 770 nm.

With regard to the spectral distribution illustrated by the broken line of FIG. 1, a correlated color temperature, duv and average color rendering index Ra thereof are 4839K, −13.6 and 86, respectively. Herein, since a correlated color temperature suitable for general lighting is 2800K or more and less than 7000K, the output light of the broken line of FIG. 1 is suitable for general lighting. Moreover, since Ra exceeds 85 though the duv stays in a range of ±30, the output light of the broken line of FIG. 1 is also close to natural light and has high color rendering properties.

Note that numeric values of the correlated color temperature, the duv and the average color rendering index Ra can be set to desired numeric values by adjusting the spectral distribution by using a light source technology related to lighting design. For example, the correlated color temperature can be adjusted so as to be an arbitrary numeric value within a range of 2800K or more and less than 18000K, and particularly 3000K or more and less than 8000K. Moreover, the average color rendering index Ra can be adjusted so as to be an arbitrary numeric value within a range of 70 or more and less than 100, and particularly 80 or more and less than 98. The duv can be adjusted so as to be an arbitrary numeric value within a range of −30 or more and less than 30, and particularly −10 or more and less than 10.

Incidentally, light with a low correlated color temperature has a light color close to that of light emitted by a light bulb, and light with a high correlated color temperature has a light color close to that of daytime sunlight. The light with a small average color rendering index becomes light advantageous for increasing luminous flux, and light with a large average color rendering index becomes light close to natural light. Light with a small duv becomes light with a relatively small green light component and assuming a purplish color, and light with a large duv becomes light assuming a greenish color that increases a luminosity factor and advantageous for increasing luminous flux. Light with nearly zero duv becomes light with a color tone close to that of natural light.

In the spectral distribution of FIG. 1, the first light component 1 is derived from blue light as the first primary light 1A emitted by the blue light emitting diode (first light emitting element 5). The second light component 2 is derived from red light as the second primary light 2A emitted by the red light emitting diode (second light emitting element 6). The third light component 3 is derived from visible converted light emitted by the $Ce^{3+}$-activated yttrium aluminum garnet-type phosphor that serves as the first phosphor 7. The fourth light component 4 is derived from visible converted light emitted by the $Cr^{3+}$-activated gadolinium gallium garnet-type phosphor that serves as the second phosphor 8.

In the spectral distribution of the output light 9, as illustrated by the solid line of FIG. 1, preferably, the intensity of the light component with the wavelength of 380 nm or more and less than 700 nm shows a maximum value. In particular, in the spectral distribution of the output light 9, a maximum intensity value of the light component with the wavelength of less than 700 nm preferably exceeds 1.5 times a maximum intensity value of the light component with the wavelength of 700 nm or more, more preferably exceeds twice the same, still more preferably exceeds three times the same. Thus, such a light emitting device is obtained, in which the ratio of the visible light component is high, and further, conversion efficiency to the visible light component is high.

In the spectral distribution of the output light 9, as illustrated by the broken line of FIG. 1, also preferably, the intensity of the light component with the wavelength of 700 nm or more shows the maximum value. In particular, in the spectral distribution of the output light 9, the maximum intensity value of the light component with the wavelength of 700 nm or more preferably exceeds 1.5 times the maximum intensity value of the light component with the wavelength of 380 nm or more and less than 700 nm, more preferably exceeds twice the same, still more preferably exceeds three times the same.

Moreover, the maximum intensity value of the light component with the wavelength of 380 nm or more and less than 700 nm is preferably less than 50% of the maximum intensity value of the light component with the wavelength of 700 nm or more, more preferably less than 30% thereof, still more preferably less than 10% thereof. Thus, such a light emitting device is obtained, in which the ratio of the near-infrared light component is high, and further, conversion efficiency to the near-infrared light component is high.

Note that, as illustrated in FIG. 1, preferably, the spectral distribution of the output light 9 does not substantially include a light component in an ultraviolet region with a wavelength of less than 380 nm. Thus, such a light emitting device is obtained, which can convert input electric power into only visible light and infrared light, and has high energy conversion efficiency to the visible light and the infrared light.

Preferably, the spectral distribution of the output light 9 has, as the fourth light component 4, a broad fluorescent component derived from $^4T_2 \rightarrow {}^4A_2$ electron energy transition of $Cr^{3+}$ ions. Moreover, preferably, the fluorescent component has a fluorescence peak in the wavelength region of 700 nm or more. Thus, the output light 9 will have a near-infrared light component across a wide wavelength range, and therefore, the light emitting device 10 can be suitably used for the hyperspectral imaging.

Preferably, the spectral distribution of the output light 9 has a light component at least across the full visible wavelength region of 410 nm or more and less than 700 nm, preferably 380 nm or more and less than 780 nm. Thus, it becomes possible to check the irradiated object by the human eye. Moreover, such a light emitting device that emits a light component, which can be used for spectral imaging, across the full wavelength range of the visible region is obtained.

[Configuration of Light Emitting Device]

Next, a specific configuration of the light emitting device according to present embodiment will be described.

As illustrated in FIGS. 2 to 6, the light emitting device 10 of the present embodiment is composed by combining at least the first light emitting element 5, the second light emitting element 6, the first wavelength converter 7A and the second wavelength converter 8A with one another. The first light emitting element 5 emits the first primary light 1A that serves as an origin of the first light component 1. The second light emitting element 6 emits the second primary light 2A that serves as an origin of the second light component 2. The first wavelength converter 7A emits the first wavelength-converted light 3A that serves as an origin of the third light component 3. The second wavelength converter 8A emits the second wavelength-converted light 4A that serves as an origin of the fourth light component 4.

Figure 3:
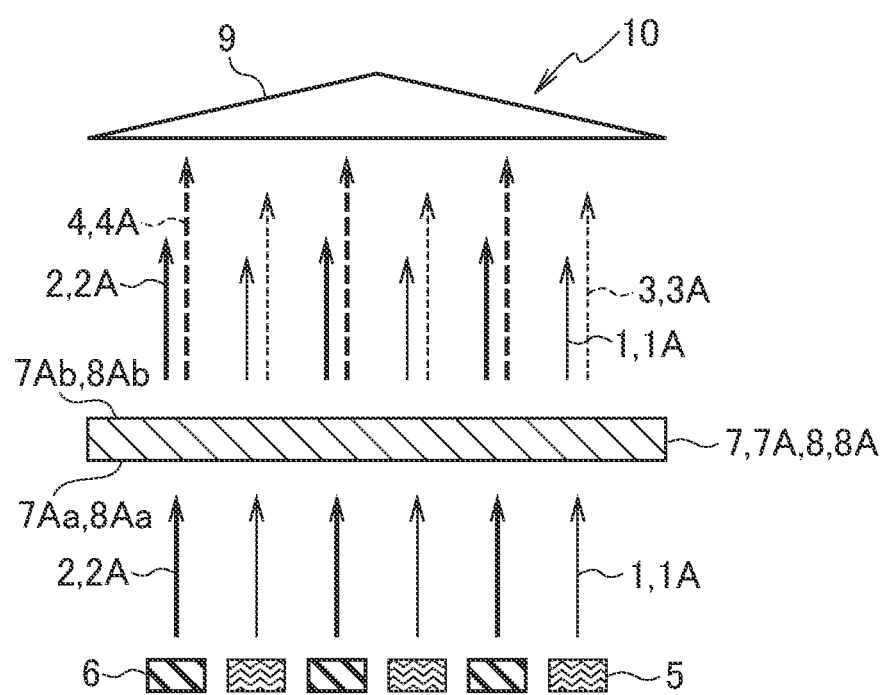
FIG. 3 is a schematic diagram illustrating another example of the configuration of the light emitting device according to the present embodiment.

The first wavelength converter 7A includes the first phosphor 7, and the second wavelength converter 8A includes the second phosphor 8. Note that the first wavelength converter 7A and the second wavelength converter 8A may be integrated with each other. That is, as illustrated in FIG. 3, both of the first phosphor 7 and the second phosphor 8 may be included in one wavelength converter.

Like the first light component 1 and the second light component 2, the first primary light 1A and the second primary light 2A are light components different in color tone from each other. Then, each of the first primary light 1A and the second primary light 2A is preferably a visible light component that has a maximum intensity value within the wavelength range of 380 nm or more and less than 700 nm, more preferably a visible light component that has a maximum intensity value within the wavelength range of 435 nm or more and less than 670 nm. For example, the first primary light 1A can be light that has a maximum intensity value within a wavelength range of 435 nm or more and less than 560 nm, preferably can be light that has a maximum intensity value within a wavelength range of 440 nm or more and less than 480 nm. The second primary light 2A can be light that has a maximum intensity value within the wavelength range of 500 nm or more and less than 700 nm, preferably can be light that has a maximum intensity value within the wavelength range of 610 nm or more and less than 670 nm.

Like the third light component 3, the first wavelength-converted light 3A is a visible light component that has a maximum intensity value within the wavelength range of 435 nm or more and less than 700 nm. For example, the first wavelength-converted light 3A can be light that has a maximum intensity value within the wavelength range of 500 nm or more and less than 600 nm, preferably can be light that has a maximum intensity value within the wavelength range of 510 nm or more and less than 560 nm.

Like the fourth light component 4, the second wavelength-converted light 4A is a near-infrared light component that has a maximum intensity value within the wavelength range of 700 nm or more and less than 2500 nm. For example, the second wavelength-converted light 4A can be light that has a maximum intensity value within the wavelength range of 750 nm or more and less than 1800 nm, preferably can be light that has a maximum intensity value within a wavelength range of 780 nm or more and less than 1500 nm.

(First Light Emitting Element 5, Second Light Emitting Element 6)

The first light emitting element 5 is a light emitting element that radiates the first primary light 1A, and the second light emitting element 6 is a light emitting element that radiates the second primary light 2A. As the first light emitting element 5 and the second light emitting element 6, for example, solid-state light emitting elements such as light emitting diodes or laser diodes can be used.

Then, as the first light emitting element 5 and the second light emitting element 6, LED modules or laser diodes, each of which emits light with energy of 1 W or more, are used, whereby such a light emitting device 10, from which light output of roughly several hundred milliwatts can be expected, is obtained. If LED modules, each of which emits light with energy of 3 W or more or 10 W or more, are used as the first light emitting element 5 and the second light emitting element 6, then such a light emitting device 10, from which light output of roughly several watts can be expected, is obtained. Moreover, as the first light emitting element 5 and the second light emitting element 6, LED modules, each of which emits light with energy of 30 W or more, are used, whereby such a light emitting device 10, from which light output exceeding 10 W can be expected, is obtained. As the first light emitting element 5 and the second light emitting element 6, LED modules, each of which emits light with energy of 100 W or more, are used, whereby such a light emitting device 10, from which light output exceeding 30 W can be expected, is obtained.

Moreover, by using the laser diode, at least either the first primary light 1A or the second primary light 2A can be made to be laser light. Thus, the light emitting device 10 is specified to apply high-density spotlight to at least either the first wavelength converter 7A or the second wavelength converter 8A. Accordingly, the light emitting device can also be a high-output point light source, and it becomes possible to extend the range where solid-state lighting is industrially used.

As such a laser diode, for example, there can be used an edge emitting laser (EEL), a vertical cavity surface emitting laser (VCSEL), and the like.

Moreover, a light guide member such as an optical fiber is provided, whereby the light emitting device 10 can be configured so that at least either the first light emitting element 5 or the second light emitting element 6 and either the first wavelength converter 7A or the second wavelength converter 8A are spatially separated from each other. Thus, such a light emitting device is obtained, which includes a light emitting portion light in weight and freely movable, and can freely change a place to be irradiated.

A light energy density of the first primary light 1A radiated by the first light emitting element 5 preferably exceeds 0.3 $W/mm^2$, more preferably exceeds 1.0 $W/mm^2$. Moreover, a light energy density of the second primary light 2A radiated by the second light emitting element 6 preferably exceeds 0.3 $W/mm^2$, more preferably exceeds 1.0 $W/mm^2$. In this case, the light energy densities of the first primary light 1A and the second primary light 2A are large. Accordingly, even if the light emitting device 10 is configured to apply the first primary light 1A and the second primary light 2A, which are light diffused, to the first wavelength converter 7A and the second wavelength converter 8A, the light emitting device 10 becomes such a light emitting device that emits the output light 9 that is relatively intense. Moreover, if the light emitting device 10 is configured to apply the first primary light 1A and the second primary light 2A, which are not light diffused, to the first wavelength converter 7A and the second wavelength converter 8A, the light emitting device 10 becomes such a light emitting device that emits the output light 9 with a large light energy density.

Upper limits of the light energy densities of the first primary light 1A emitted by the first light emitting element 5 and the second primary light 2A emitted by the second light emitting element 6 are not particularly limited; however, can be set to 30 $W/mm^2$ for example.

As mentioned above, in the light emitting device 10, the first light emitting element 5 and the second light emitting element 6 are preferably solid-state light emitting elements, and are preferably at least either the light emitting diodes or the laser diodes. However, the first light emitting element 5 and the second light emitting element 6 are not limited to these, and every light emitting element can be used as long as the light emitting element is capable of emitting the high-output first primary light 1A or second primary light 2A.

At least either the first light emitting element 5 or the second light emitting element 6 is preferably configured to include a plurality of solid-state light emitting elements. In such a way, it becomes easy to increase the outputs of the first primary light 1A and the second primary light 2A, and accordingly, such a light emitting device advantageous for increasing the output is obtained. Note that, though the number of solid-state light emitting elements is not particularly limited, for example, the number can be set to 9 or more, 16 or more, 25 or more, 36 or more, 49 or more, 64 or more, 81 or more, or 100 or more. Note that, though an upper limit of the number of solid-state light emitting elements is not particularly limited, and for example, the upper limit of the number can be set to 9, 16, 25, 36, 49, 64, 81 or 100.

In the light emitting device 10, preferably, at least either the first light emitting element 5 or the second light emitting element 6 is a surface emitting-type light source. Moreover, preferably, both of the first light emitting element 5 and the second light emitting element 6 are surface emitting-type light sources. Thus, variations of the intensity distributions and unevenness of the color tones in the first primary light 1A and the second primary light 2A, which are applied to the wavelength converters, can be suppressed. Accordingly, such a light emitting device capable of suppressing the variations of the intensity distributions and the unevenness of the color tones in the output light 9 is obtained.

(First Wavelength Converter, Second Wavelength Converter)

In the light emitting device 10 according to the present embodiment, the first wavelength converter 7A can be fabricated by sealing at least the first phosphor 7 by a sealing material. Moreover, the second wavelength converter 8A can be fabricated by sealing at least the second phosphor 8 by the sealing material. Preferably, the sealing material is at least either an organic material or an inorganic material, and particularly, at least either a transparent (translucent) organic material or a transparent (translucent) inorganic material. As such a sealing material made of the organic material, for example, a transparent organic material such as a silicone resin is mentioned. As such a sealing material made of the inorganic material, for example, a transparent inorganic material such as low-melting-point glass is mentioned.

Moreover, the first wavelength converter 7A can be an all-inorganic wavelength converter composed mainly of the first phosphor by using a binder and the like. Further, the first wavelength converter 7A can be a sintered body of an inorganic material, that is, fluorescent ceramics by sintering the first phosphor. Likewise, the second wavelength converter 8A can be an all-inorganic wavelength converter composed mainly of the second phosphor by using the binder and the like. Further, the second wavelength converter 8A can be a sintered body of an inorganic material, and particularly, fluorescent ceramics by sintering the second phosphor. Moreover, such wavelength converters and fluorescent ceramics as described above can be composited as appropriate. For example, the wavelength converters and the fluorescent ceramics can also be used by being stacked on each other.

The wavelength converters sealed with resin can be produced relatively easily by using powder phosphors, and accordingly, an advantage is brought in terms of providing a relatively inexpensive light emitting device. Moreover, the all-inorganic wavelength converters are excellent in thermal conductivity, and accordingly, heat dissipation design of the light emitting device is facilitated. Accordingly, a temperature rise of the wavelength converters is suppressed to make it possible to reduce the temperature quenching of the phosphors, and accordingly, such a light emitting device advantageous for increasing the output is obtained.

A thickness of each of the first wavelength converter 7A and the second wavelength converter 8A is not particularly limited. However, in an example, a maximum thickness of each of the first wavelength converter 7A and the second wavelength converter 8A is preferably 100 µm or more and less than 5 mm, more preferably 200 µm or more and less than 1 mm.

Preferably, the first wavelength converter 7A is disposed so as to cover the entire light output surface of the first light emitting element 5. Moreover, more preferably, the first light emitting element 5 is a surface-emitting light source, and the first wavelength converter 7A is disposed so as to cover the entire light output surface of the surface-emitting light source. Likewise, the second wavelength converter 8A is preferably disposed so as to cover the entire light output surface of the second light emitting element 6. Moreover, more preferably, the second light emitting element 6 is a surface-emitting light source, and the second wavelength converter 8A is disposed so as to cover the entire light output surface of the surface-emitting light source. Thus, the light emitting device 10 is configured so that the first primary light 1A is efficiently applied to the first wavelength converter 7A. Likewise, the light emitting device 10 is configured so that the second primary light 2A is efficiently applied to the second wavelength converter 8A. Accordingly, there increases conversion efficiency of each of the first primary light 1A and the second primary light 2A, and such a highly efficient light emitting device 10 is obtained.

Note that, preferably, the first wavelength converter 7A and the second wavelength converter 8A have translucency. Thus, the light components generated by the wavelength conversion in the inside of the wavelength converters can be outputted efficiently, and such a light emitting device advantageous for increasing the output is obtained.

(First Phosphor)

The first phosphor 7 is a phosphor that absorbs at least a part of the first primary light 1A emitted by the first light emitting element 5 and converts the same into the first wavelength-converted light 3A. As the first phosphor 7, for example, a variety of inorganic phosphors known as those for use in solid-state illumination light sources can be used.

For example, when a phosphor that emits blue wavelength-converted light showing a maximum fluorescence intensity value within a wavelength range of 435 nm or more and less than 500 nm is used as the first phosphor 7, the output light 9 will include a blue light component. At this time, as the first primary light 1A, light can be used, which shows a maximum fluorescence intensity value within a range of the wavelength of 380 nm or more and less than a wavelength showing the above-described maximum fluorescence intensity value.

For example, when a phosphor that emits blue green or green wavelength-converted light showing a maximum fluorescence intensity value within a wavelength range of 470 nm or more and less than 530 nm is used as the first phosphor 7, the output light 9 will include a blue green light component. At this time, as the first primary light 1A, light can be used, which shows a maximum intensity value within a range of the wavelength of 380 nm or more and less than a wavelength showing the above-described maximum fluorescence intensity value.

For example, when a phosphor that emits green or yellow green wavelength-converted light showing a maximum fluorescence intensity value within a wavelength range of 500 nm or more and less than 560 nm is used as the first phosphor 7, the output light 9 will include a green light component. At this time, as the first primary light 1A, light can be used, which shows a maximum intensity value within a range of the wavelength of 380 nm or more and less than a wavelength showing the above-described maximum fluorescence intensity value. Moreover, preferably, as the first primary light 1A, light showing a maximum intensity value within the wavelength range of 435 nm or more and less than 500 nm is used.

For example, when a phosphor that emits yellow or orange wavelength-converted light showing a maximum fluorescence intensity value within a wavelength range of 560 nm or more and less than 600 nm is used as the first phosphor 7, the output light 9 will include a yellow light component. At this time, as the first primary light 1A, light can be used, which shows a maximum intensity value within a range of the wavelength of 380 nm or more and less than a wavelength showing the above-described maximum fluorescence intensity value. Moreover, preferably, as the first primary light 1A, light showing a maximum intensity value within the wavelength range of 435 nm or more and less than 500 nm or 500 nm or more and less than 560 nm is used.

For example, when a phosphor that emits red or deep red wavelength-converted light showing a maximum fluorescence intensity value within the wavelength range of 600 nm or more and less than 700 nm, and particularly 610 nm or more and less than 660 nm is used as the first phosphor 7, the output light 9 will include a red light component. At this time, as the first primary light 1A, light can be used, which shows a maximum intensity value within a range of the wavelength of 380 nm or more and less than a wavelength showing the above-described maximum fluorescence intensity value. Moreover, preferably, as the first primary light 1A, light showing a maximum intensity value within the wavelength range of 435 nm or more and less than 500 nm, or 500 nm or more and less than 560 nm, or 560 nm or more and less than 600 nm is used.

Note that, when as the first phosphor 7, used is a phosphor that emits wavelength-converted light including a blue green light component with a high luminosity factor in scotopic vision, such a light emitting device 10 that emits the output light 9 easy to visually recognize in darkness and deep darkness is obtained. Moreover, when as the first phosphor 7, used is a phosphor that emits wavelength-converted light including a green light component with a high luminosity factor in photopic vision, such a light emitting device 10 that emits the output light 9 easy to visually recognize in a bright place is obtained.

When a phosphor that emits wavelength-converted light including a yellow light component is used as the first phosphor 7, for example, such a light emitting device 10 advantageous under a working environment where a resin sensitive to ultraviolet rays and blue light is used is obtained. Moreover, when a phosphor that emits wavelength-converted light including a red light component is used as the first phosphor 7, such a light emitting device 10 is obtained, which emits the output light 9 improving appearances of meats, tuna or apple, human skin or the like.

As the first phosphor 7, a phosphor can be used, which is activated by at least either rare earth ions or transition metal ions, and emits visible fluorescence. Preferably, the rare earth ions are at least either $Ce^{3+}$ or $Eu^{2+}$, and preferably, the transition metal ions are particularly $Mn^{4+}$. Then, as the first phosphor 7, a phosphor can be used, which contains the above-mentioned ions as a light emission center, and contains, as a matrix, at least one of oxide, sulfide, nitride, halide, oxysulfide, oxynitride and oxyhalide.

More specifically, preferably, the phosphor usable as the first phosphor 7 is at least one selected from the group consisting of halophophate, phosphate, halosilicate, silicate, aluminate, aluminosilicate, borate, germanate, silicate nitride, aluminosilicate nitride, silicate oxynitride and aluminosilicate oxynitride. Then, the first phosphor 7 just needs to appropriately select and use one, which is suitable for lighting design, from among these compounds.

A phosphor particularly preferable as the first phosphor 7 is a composite oxide phosphor that has a garnet-type crystal structure and is activated by $Ce^{3+}$. Such a $Ce^{3+}$-activated garnet phosphor is a rare earth aluminum garnet phosphor. Specifically, it is preferable that the $Ce^{3+}$-activated garnet phosphor be at least one selected from the group consisting of $Lu_3Al_2(AlO_4)_3:Ce^{3+}$, $Y_3Al_2(AlO_4)_3:Ce^{3+}$, $Lu_3Ga_2(AlO_4)_3:Ce^{3+}$ and $Y_3Ga_2(AlO_4)_3:Ce^{3+}$. Moreover, it is also preferable that the $Ce^{3+}$-activated garnet phosphor is a solid solution composed by including these phosphors as end members.

A lot of the $Ce^{3+}$-activated garnet phosphors have properties of absorbing blue light and converting the blue light into green light. Accordingly, a solid-state light emitting element that emits blue light can be used as the first light emitting element 5 that emits the first primary light 1A. Thus, such output light 9 with high color rendering properties, which includes at least two types, blue and green, of light components can be obtained.

Moreover, as the in-vehicle headlamp technology, the high-output projector technology and the like have progressed, a ceramic technology of the $Ce^{3+}$-activated garnet phosphor, which is advantageous for increasing the output and ensuring reliability has also progressed in recent years. Accordingly, use of the fluorescent ceramics also makes it easy to provide such a light emitting device 10 advantageous for increasing the output and ensuring the reliability.

(Second Phosphor)

The second phosphor 8 is a phosphor that absorbs at least either the first primary light 1A emitted by the first light emitting element 5 or the second primary light 2A emitted by the second light emitting element 6, and converts the same into the second wavelength-converted light 4A. At this time, the second phosphor 8 absorbs at least a part of the applied primary light. Moreover, preferably, the second phosphor 8 is a phosphor that absorbs the second primary light 2A emitted by the second light emitting element 6, and converts the same into the second wavelength-converted light 4A. As the second phosphor 8, for example, a variety of inorganic phosphors known as those for use in near-infrared light sources can be used.

For example, when a phosphor that emits near-infrared wavelength-converted light showing a maximum fluorescence intensity value within a wavelength range of 700 nm or more and less than 1700 nm is used as the second phosphor 8, the output light 9 can include light components with absorption wavelengths of a variety of gas molecules. At this time, as the primary light to be absorbed, light showing a maximum intensity value within the wavelength range of 380 nm or more and less than 700 nm can be used. Moreover, preferably, as the first primary light, green to yellow light showing a maximum intensity value within the wavelength range of 500 nm or more and less than 580 nm, or red light showing a maximum intensity value within the wavelength range of 600 nm or more and less than 680 nm is used.

Note that, for example, the absorption wavelengths of the variety of gas molecules are as follows: 760 nm for $O_2$; 830 nm for $NO_2$; 1365 nm for $H_2O$; 1530 nm for $NH_3$; 1530 nm for $C_2H_2$; 1567 nm for CO; 1573 nm for $CO_2$; and 1651 nm for $CH_4$.

Herein, by using near-infrared spectroscopy, information regarding oxygen ($O_2$), nitrogen dioxide ($NO_2$) and objects including these components can be obtained. Then, as the second phosphor 8 to be used for such a purpose, a phosphor is suitable, which emits wavelength-converted light showing a maximum fluorescence intensity value within a wavelength range of more than 700 nm and less than 900 nm, preferably within a wavelength range of more than 750 nm and less than 850 nm.

By using the near-infrared spectroscopy, information regarding water ($H_2O$) and an object including water can be obtained. Then, as the second phosphor 8 to be used for such a purpose, a phosphor is suitable, which emits wavelength-converted light showing a maximum fluorescence intensity value within a wavelength range of more than 1200 nm and less than 1500 nm, preferably within a wavelength range of more than 1275 nm and less than 1425 nm.

By using the near-infrared spectroscopy, information regarding ammonia ($NH_3$), hydrocarbon ($C_2H_2$, $CH_4$ or the like), carbon oxide (CO, $CO_2$ or the like) and objects including these components can be obtained. Then, as the second phosphor 8 to be used for such a purpose, a phosphor is suitable, which emits wavelength-converted light showing a maximum fluorescence intensity value within a wavelength range of more than 1400 nm and less than 1800 nm, preferably within a wavelength range of more than 1500 nm and less than 1700 nm.

On the contrary, the second wavelength-converted light 4A emitted from the second phosphor 8 is absorbed by oxygen or nitrogen dioxide, whereby an object and a system are sometimes adversely affected. In this case, as the second phosphor 8, preferably used is a phosphor in which a maximum intensity value within the wavelength range of more than 750 nm and less than 850 nm is less than 10% of a maximum intensity value within the wavelength range of 700 nm or more and less than 1700 nm. Moreover, as the second phosphor 8, preferably, used is a phosphor in which a maximum intensity value within the wavelength range of more than 700 nm or more and less than 900 nm is less than 10% of a maximum intensity value within the wavelength range of 700 nm or more and less than 1700 nm. Further, as the second phosphor 8, more preferably, used is a phosphor that does not have a light component within the above-described wavelength ranges.

Moreover, the second wavelength-converted light 4A emitted from the second phosphor 8 is absorbed by water, whereby an object and a system are sometimes adversely affected. In this case, as the second phosphor 8, preferably used is a phosphor in which a maximum intensity value within the wavelength range of more than 1275 nm and less than 1425 nm is less than 10% of a maximum intensity value within the wavelength range of 700 nm or more and less than 1700 nm. Moreover, as the second phosphor 8, preferably, used is a phosphor in which a maximum intensity value within the wavelength range of more than 1200 nm and less than 1500 nm is less than 10% of a maximum intensity value within the wavelength range of 700 nm or more and less than 1700 nm. Further, as the second phosphor 8, more preferably, used is a phosphor that does not have a light component within the above-described wavelength ranges.

The second wavelength-converted light 4A emitted from the second phosphor 8 is absorbed by ammonia, hydrocarbon or carbon oxide, whereby an object and a system are sometimes adversely affected. In this case, as the second phosphor 8, preferably used is a phosphor in which a maximum intensity value within the wavelength range of more than 1500 nm or more and less than 1700 nm is less than 10% of a maximum intensity value within the wavelength range of 700 nm or more and less than 1700 nm. Moreover, as the second phosphor 8, preferably, used is a phosphor in which a maximum intensity value within the wavelength range of more than 1400 nm and less than 1800 nm is less than 10% of a maximum intensity value within the wavelength range of 700 nm or more and less than 1700 nm. Further, as the second phosphor 8, more preferably, used is a phosphor that does not have a light component within the above-described wavelength ranges.

Note that a light emitting device using, as the second phosphor 8, the phosphor that emits the near-infrared wavelength-converted light outputs a light component with high spectral sensitivity of a photodiode. Then, the photodiode is used exclusively for a sensor for a detector. Accordingly, such a light emitting device can be suitably used for an inspection device using the photodiode.

For example, in the case of being oriented for use in an inspection device using a Si photodiode or a Si—PIN photodiode, preferably, the second phosphor 8 is a phosphor that emits wavelength-converted light showing a maximum fluorescence intensity value within a wavelength range of 700 nm or more and less than 1100 nm. Moreover, in this case, more preferably, the second phosphor 8 is a phosphor that emits wavelength-converted light showing a maximum fluorescence intensity value within a wavelength range of 780 nm or more and less than 1050 nm, and particularly, within a wavelength range of 800 nm or more and less than 1000 nm.

For example, in the case of being oriented for use in an inspection device using a Ge photodiode, preferably, the second phosphor 8 is a phosphor that emits wavelength-converted light showing a maximum fluorescence intensity value within a wavelength range of 700 nm or more and less than 1600 nm. Moreover, in this case, more preferably, the second phosphor 8 is a phosphor that emits wavelength-converted light showing a maximum fluorescence intensity value within a wavelength range of 1100 nm or more and less than 1550 nm, and particularly, 1300 nm or more and less than 1500 nm.

For example, in the case of being oriented for use in an inspection device using an InGaAs photodiode, preferably, the second phosphor 8 is a phosphor that emits wavelength-converted light showing a maximum fluorescence intensity value within a wavelength range of 900 nm or more and less than 1650 nm. Moreover, in this case, more preferably, the second phosphor 8 is a phosphor that emits wavelength-converted light showing a maximum fluorescence intensity value within a wavelength range of 1000 nm or more and less than 1600 nm, and particularly, within a wavelength range of 1100 nm or more and less than 1600 nm.

Moreover, such a light emitting device using, as the second phosphor 8, the phosphor that emits relatively short wavelength-side near-infrared light is unlikely to output a light component with a wavelength of 4000 nm or more, the light component serving as a heat ray. Accordingly, such a light emitting device can be suitably used for inspecting an object prone to be degraded by heat.

Meanwhile, as the second phosphor 8, there can also be used a phosphor that emits relatively long wavelength-side near-infrared light showing a maximum fluorescence intensity value within a wavelength range of 780 nm or more and less than 2500 nm, preferably 800 nm or more and less than 2500 nm. Thus, the output light 9 can include an infrared light component invisible to a human eye. Then, at this time, as the primary light to be absorbed, light showing a maximum intensity value within the visible wavelength range of 380 nm or more and less than 700 nm can be used.

Such a light emitting device using the phosphor that emits the relatively long wavelength-side near-infrared light is unlikely to output a visible light component with a wavelength shorter than 780 nm, which is visible to a human eye. Accordingly, such a light emitting device can be suitably used for monitoring in which it is disadvantageous that the presence of the output light 9 is perceived by persons.

As the second phosphor 8, a phosphor can be used, which is activated by at least either rare earth ions or transition metal ions, and emits fluorescence including the near-infrared light component. Preferably, the rare earth ions are at least one selected from the group consisting of $Nd^{3+}$, $Eu^{2+}$, $Ho^{3+}$, $Er^{3+}$, $Tm^{3+}$ and $Yb^{3+}$. Preferably, the transition metal ions are at least one selected from the group consisting of $Ti^{3+}$, $V^{4+}$, $Cr^{4+}$, $V^{3+}$, $Cr^{3+}$, $V^{2+}$, $Mn^{4+}$, $Fe^{3+}$, $Co^{3+}$, $Co^{2+}$ and $Ni^{2+}$. Then, like the first phosphor 7, as the second phosphor 8, a phosphor can be used, which contains the above-mentioned ions as a light emission center, and contains, as a matrix, at least one of oxide, sulfide, nitride, halide, oxysulfide, oxynitride and oxyhalide.

Note that the ions which function as fluorescent ions as the second phosphor 8 can be at least either the above-mentioned rare earth ions or the above-mentioned transition metal ions. Then, it is sufficient if the fluorescent ions have properties of absorbing at least either the first primary light 1A or the second primary light 2A and converting the same to the near-infrared light component. However, preferable fluorescent ions are $Cr^{3+}$. That is, preferably the second phosphor 8 includes $Cr^{3+}$ as the fluorescent ions.

$Cr^{3+}$ is used as the fluorescent ions, whereby it becomes easy to obtain the second phosphor 8 having properties of absorbing visible light, particularly, blue light or red light and converting the same to a near-infrared light component. Moreover, depending on a type of the matrix, it also becomes easy to change a light absorption peak wavelength and a fluorescence peak wavelength, and an advantage is brought in terms of changing an excitation spectrum shape and a fluorescence spectrum shape. Moreover, a lot of the $Cr^{3+}$-activated phosphors, each of which absorbs blue light and red light and converts the same into a near-infrared fluorescent component, are known. Accordingly, not only ranges of selection of the first light emitting element 5 and the second light emitting element 6 are widened, but also it becomes easy to change a fluorescence peak wavelength of the second wavelength-converted light 4A emitted by the second phosphor 8, and accordingly, an advantage is brought in terms of controlling the spectral distribution of the output light.

Note that a type of the phosphor in which $Cr^{3+}$ serves as the fluorescent ions is not particularly limited as long as the phosphor absorbs at least either the first primary light 1A or the second primary light 2A and converts the same into an infrared fluorescent component. However, as the $Cr^{3+}$-activated phosphor, composite metal oxides easy to produce can be mentioned.

A phosphor particularly preferable as the second phosphor 8 is a composite oxide phosphor that has a garnet-type crystal structure and is activated by $Cr^{3+}$. Preferably, such a $Cr^{3+}$-activated garnet phosphor is at least either a rare earth aluminum garnet phosphor or a rare earth gallium garnet phosphor. Specifically, it is preferable that the $Cr^{3+}$-activated garnet phosphor be at least one selected from the group consisting of $Y_3Al_2(AlO_4)_3:Cr^{3+}$, $La_3Al_2(AlO_4)_3:Cr^{3+}$, $Gd_3Al_2(AlO_4)_3:Cr^{3+}$, $Y_3Ga_2(AlO_4)_3:Cr^{3+}$, $La_3Ga_2(AlO_4)_3:Cr^{3+}$, $Gd_3Ga_2(AlO_4)_3:Cr^{3+}$, $Y_3Sc_2(AlO_4)_3:Cr^{3+}$, $La_3Sc_2(AlO_4)_3:Cr^{3+}$, $Gd_3Sc_2(AlO_4)_3:Cr^{3+}$, $Y_3Ga_2(GaO_4)_3:Cr^{3+}$, $La_3Ga_2(GaO_4)_3:Cr^{3+}$, $(Gd,La)_3Ga_2(GaO_4)_3:Cr^{3+}$, $Gd_3Ga_2(GaO_4)_3:Cr^{3+}$, $Y_3Sc_2(GaO_4)_3:Cr^{3+}$, $La_3Sc_2(GaO_4)_3:Cr^{3+}$, $Gd_3Sc_2(GaO_4)_3:Cr^{3+}$, and $(Gd,La)_3(Ga,Sc)_2(GaO_4)_3:Cr^{3+}$. Moreover, the $Ce^{3+}$-activated garnet phosphor may be a solid solution composed by including these phosphors as end members.

Such a phosphor can be synthesized by using a conventional solid phase reaction. For example, mixed powder of plurality of types of metal oxides including constituent elements (rare earths, Al, Ga, Cr and the like) of the phosphor is used as a raw material, and is fired at approximately 1600° C., whereby the phosphor can be synthesized.

Moreover, for example, a $(Gd,La)_3(Ga,Sc)_2(GaO_4)_3:Cr^{3+}$ phosphor represented by a composition formula $(Gd_{0.75}La_{0.25})_3(Ga_{0.5}Sc_{0.47}Cr_{0.03})_2(GaO_4)_3$ has peaks of an excitation spectrum at around a wavelength of 460 nm and around a wavelength of 640 nm. Then, this phosphor can absorb light with these wavelengths, and can convert the same into a light component having a fluorescence peak at around a wavelength of 780 nm. Note that this phosphor can absorb the light at around the wavelength of 460 nm and the light at around the wavelength of 640 nm at a light absorption rate more than 60%, and further, can perform wavelength conversion for the same at a photon conversion efficiency as high as approximately 90%.

A lot of the $Cr^{3+}$-activated garnet phosphors have properties of absorbing blue light or red light and converting the same into deep red to near-infrared light. Accordingly, as the first light emitting element 5 and/or the second light emitting element 6, there can be used a solid-state light emitting element that emits blue light and/or a solid-state light emitting element that emits red light. Thus, the output light 9 can be obtained, which includes at least one light component (blue or red) that constitutes the three primary colors (blue, green and red) of light and the near-infrared light component.

Particularly, the first light emitting element 5 that emits the first primary light 1A is used as the solid-state light emitting element that emits blue light, and the second light emitting element 6 that emits the second primary light 2A is used as the solid-state light emitting element that emits red light. Further, the first phosphor 7 that emits the first wavelength-converted light 3A is used as the $Ce^{3+}$-activated garnet phosphor that converts, into green light, the blue light emitted by the first light emitting element 5. Moreover, the second phosphor 8 that emits the second wavelength-converted light 4A is used as the $Cr^{3+}$-activated garnet phosphor that converts, into near-infrared light, the red light emitted by the second light emitting element 6. With such a configuration, such a light emitting device 10 is obtained, which is easy to obtain the output light 9 with high color rendering properties, which is composed by including the light components which constitute the three primary colors (blue, green, red) of light and the near-infrared light component.

Moreover, in recent years, the material technology of the $Ce^{3+}$-activated garnet phosphor has progressed while including the ceramic technology. Accordingly, it is also easy to apply the technology cultivated in the $Ce^{3+}$-activated garnet phosphor to the $Cr^{3+}$-activated garnet phosphor. Then, when the fluorescent ceramics mainly composed of the $Cr^{3+}$-activated garnet phosphor is used, an advantage is brought in terms of increasing the output of near-infrared light component (fourth light component 4) and ensuring the reliability of the device.

Further, a wide variety of the $Ce^{3+}$-activated garnet phosphors are present, and accordingly, it is also easy to procure technologies related to these Therefore, such a $Cr^{3+}$-activated garnet phosphor for which the technologies cultivated in the $Ce^{3+}$-activated garnet phosphor can be horizontally developed is used, whereby a desired light emitting device can be developed efficiently.

(Operation of Light Emitting Device)

An operation of the light emitting device 10 of the present embodiment will be described with reference to FIGS. 2 to 6. First, when electric power is supplied to the first light emitting element 5 and the second light emitting element 6, the first light emitting element 5 emits the first primary light 1A, and the second light emitting element 6 emits the second primary light 2A.

When the first primary light 1A radiated from the first light emitting element 5 enters the first wavelength converter 7A, the first wavelength converter 7A absorbs a part of the first primary light 1A, and radiates the first wavelength-converted light 3A lower in light energy than the same. Meanwhile, when the second primary light 2A radiated from the second light emitting element 6 enters the second wavelength converter 8A, the second wavelength converter 8A absorbs a part of the second primary light 2A, and radiates the second wavelength-converted light 4A lower in light energy than the same.

The first primary light 1A, the second primary light 2A, the first wavelength-converted light 3A and the second wavelength-converted light 4A, which are generated as described above, serve as origins of generating the first light component 1, second light component 2, the third light component 3 and the fourth light component, respectively. Then, these light components form the spectral distribution, and are output as the output light 9.

(Basic Configuration of Light Emitting Device)

In the light emitting device illustrated in FIGS. 2 to 6, for example, the first primary light 1A can be blue light emitted by a solid-state light emitting element. For example, the second primary light 2A can be red light emitted by a solid-state light emitting element. For example, the first wavelength-converted light 3A can be green light obtained by performing wavelength conversion for the blue light by the first phosphor 7. For example, the second wavelength-converted light 4A can be near-infrared light obtained by performing wavelength conversion for the red light by the second phosphor 8.

In such a configuration, the first light emitting element 5 can be a solid-state light emitting element that emits, as the first primary light 1A, blue light having a peak within a wavelength range of 430 nm or more and less than 480 nm, preferably 440 nm or more and less than 470 nm. The second light emitting element 6 can be a solid-state light emitting element that emits, as the second primary light 2A, red light having a fluorescence peak within the wavelength range of 600 nm or more and less than 680 nm, preferably 610 nm or more and less than 660 nm. The first phosphor 7 can be a phosphor that absorbs blue light and converts the blue light into green light that serves as the first wavelength-converted light 3A, and can be a phosphor activated by $Ce^{3+}$ or $Eu^{2+}$, and particularly a $Ce^{3+}$-activated garnet phosphor. The second phosphor 8 can be a phosphor that absorbs blue light and/or red light and converts the blue light and/or the red light into near-infrared light that serves as the second wavelength-converted light 4A, and can be a phosphor activated by transition metal ions, and particularly a $Cr^{3+}$-activated garnet phosphor.

Note that, according to the purpose, in place of the solid-state light emitting element that emits red light, the second light emitting element 6 can be a solid-state light emitting element that emits light of another color. Specifically, the second light emitting element 6 can also be a solid-state light emitting element that emits green light having a fluorescence peak within the wavelength range of 500 nm or more and less than 560 nm, preferably 510 nm or more and less than 550 nm. Moreover, the second light emitting element 6 can also be a solid-state light emitting element that emits yellow light or orange light having a fluorescence peak within the wavelength range of 560 nm or more and less than 600 nm, preferably 575 nm or more and less than 600 nm.

With such a configuration, the output light 9 including the first light component 1, the second light component 2, the third light component 3 and the fourth light component will have both of the visible and near-infrared light components. Moreover, in the output light 9, the fluorescence intensity in the vicinity of a boundary between the visible light and the near-infrared light becomes small, and the output light 9 will have a spectral distribution in which these are separated from each other with clarity to some extent or more.

Moreover, the first primary light 1A that serves as an origin of the first light component 1 and the second primary light 2A that serves as an origin of the second light component 2 can change color tones thereof by changing the types of the first light emitting element 5 and the second light emitting element 6, respectively. Likewise, the first wavelength-converted light 3A that serves as an origin of the third light component 3 and the second wavelength-converted light 4A that serves as an origin of the fourth light component 4 can change color tones thereof by changing the types of the first wavelength converter 7A and the second wavelength converter 8A, respectively. Moreover, a ratio of the electric powers supplied to the first light emitting element 5 and the second light emitting element 6, thicknesses of the first wavelength converter 7A and the second wavelength converter 8A or concentrations of the phosphors therein are changed, whereby an output ratio of the respective light components can also be changed. Accordingly, with such a configuration, it becomes easy to control the spectral distribution of the output light 9.

Note that, preferably, the wavelength converter including the second phosphor allows transmission of the fourth light component 4. That is, preferably, the second wavelength converter 8A including the second phosphor 8 has characteristics of allowing transmission of the second wavelength-converted light 4A that serves as an origin of the fourth light component 4. In such a way, the second wavelength converter 8A allows transmission of the near-infrared light component, and photons are suppressed from being absorbed by the wavelength converter itself and disappearing. Accordingly, such a light emitting device advantageous for increasing the output of the near-infrared rays is obtained.

Figure 2:
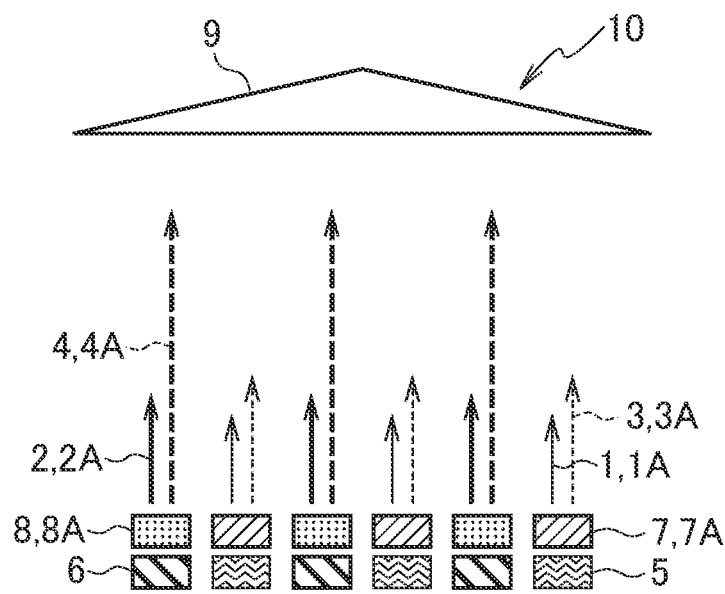
FIG. 2 is a schematic diagram illustrating an example of a configuration of the light emitting device according to the present embodiment.

As illustrated in FIG. 2, the light emitting device 10 may be configured to use a first wavelength conversion-type light emitting element obtained by combining the first light emitting element 5 and the first wavelength converter 7A with each other, and a second wavelength conversion-type light emitting element obtained by combining the second light emitting element 6 and the second wavelength converter 8A with each other. In such a way, the first wavelength conversion-type light emitting element and the second wavelength conversion-type light emitting element, which are designed so as to emit lights different in color tone from each other, are procured in advance, whereby the color tone of the output light 9 can be controlled only by a combination of these. Accordingly, such a light emitting device advantageous for meeting a customer's demand is obtained.

As illustrated in FIG. 3, the light emitting device 10 may be configured to integrate the first wavelength converter 7A and the second wavelength converter 8A with each other, and to irradiate one wavelength converter with both of the first primary light 1A emitted by the first light emitting element 5 and the second primary light 2A emitted by the second light emitting element 6. In such a way, a ratio of the first phosphor 7 and the second phosphor 8, which are included in the wavelength converter, whereby the color tone of the output light 9 can be controlled. Moreover, a number ratio of the first light emitting element 5 and the second light emitting element 6 is just changed, whereby the color tone of the output light 9 can be controlled. Further, the wavelength converters, the first light emitting element 5, and the second light emitting element 6, which are designed so as to emit the lights different in color tone from one another, are procured in advance, whereby the color tone of the output light 9 can be controlled only by a combination of these. Accordingly, such a light emitting device advantageous for meeting a customer's demand is obtained.

Figure 4:
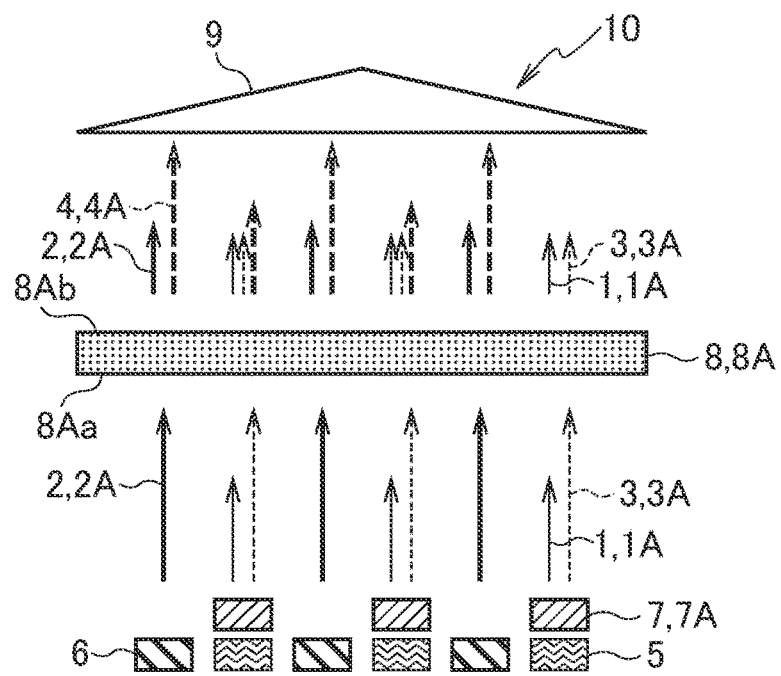
FIG. 4 is a schematic diagram illustrating another example of the configuration of the light emitting device according to the present embodiment.

As illustrated in FIG. 4, the light emitting device 10 may be configured to use the first wavelength conversion-type light emitting element obtained by combining the first light emitting element 5 and the first wavelength converter 7A with each other, the second light emitting element 6 and the second wavelength converter 8A. In this case, the light emitting device 10 is configured to irradiate the second wavelength converter 8A with both of the first primary light 1A that transmits through the first wavelength converter 7A and the second primary light 2A. In such a way, the first wavelength conversion-type light emitting element, the second light emitting element 6, and the second wavelength converter 8A, which are designed so as to emit lights different in color tone from one another, are procured in advance, whereby the color tone of the output light 9 can be controlled only by a combination of these. Accordingly, such a light emitting device advantageous for meeting a customer's demand is obtained.

Figure 5:
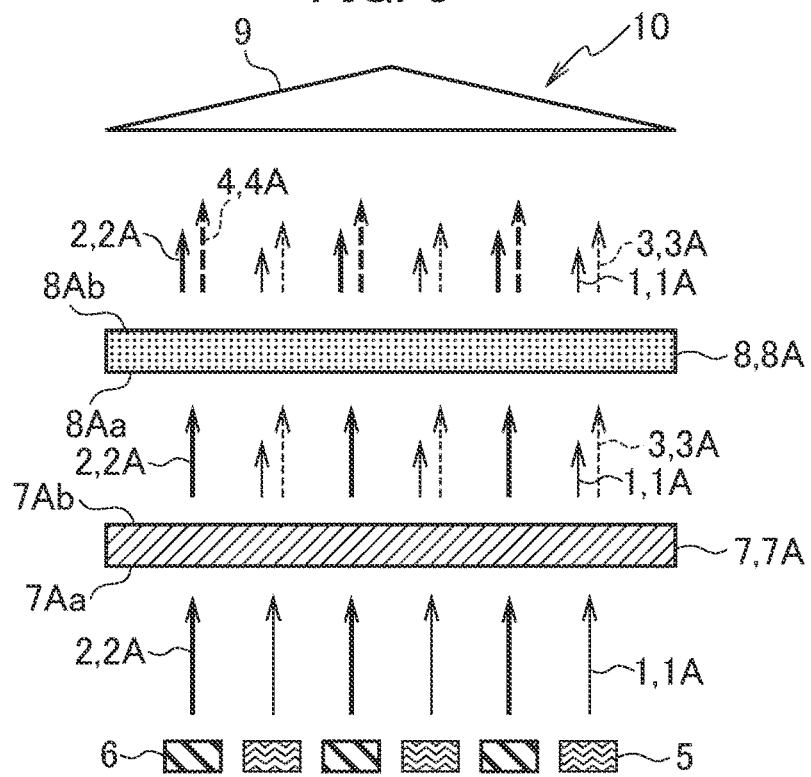
FIG. 5 is a schematic diagram illustrating another example of the configuration of the light emitting device according to the present embodiment.

As illustrated in FIG. 5, the light emitting device 10 may be configured to use the first light emitting element 5, the second light emitting element 6, the first wavelength converter 7A, and the second wavelength converter 8A, which are individually prepared in advance. In this case, the light emitting device 10 is configured to irradiate the first wavelength converter 7A with both of the first primary light 1A and the second primary light 2A, and further, to irradiate the second wavelength converter 8A with both of the first primary light 1A and the second primary light 2A, which transmit through the first wavelength converter 7A. In such a way, the first light emitting element 5, the second light emitting element 6, the first wavelength converter 7A, and the second wavelength converter 8A, which are designed so as to emit lights different in color tone from one another, are procured in advance, whereby the color tone of the output light 9 can be controlled only by a combination of these. Accordingly, such a light emitting device advantageous for meeting a customer's demand is obtained.

Figure 6:
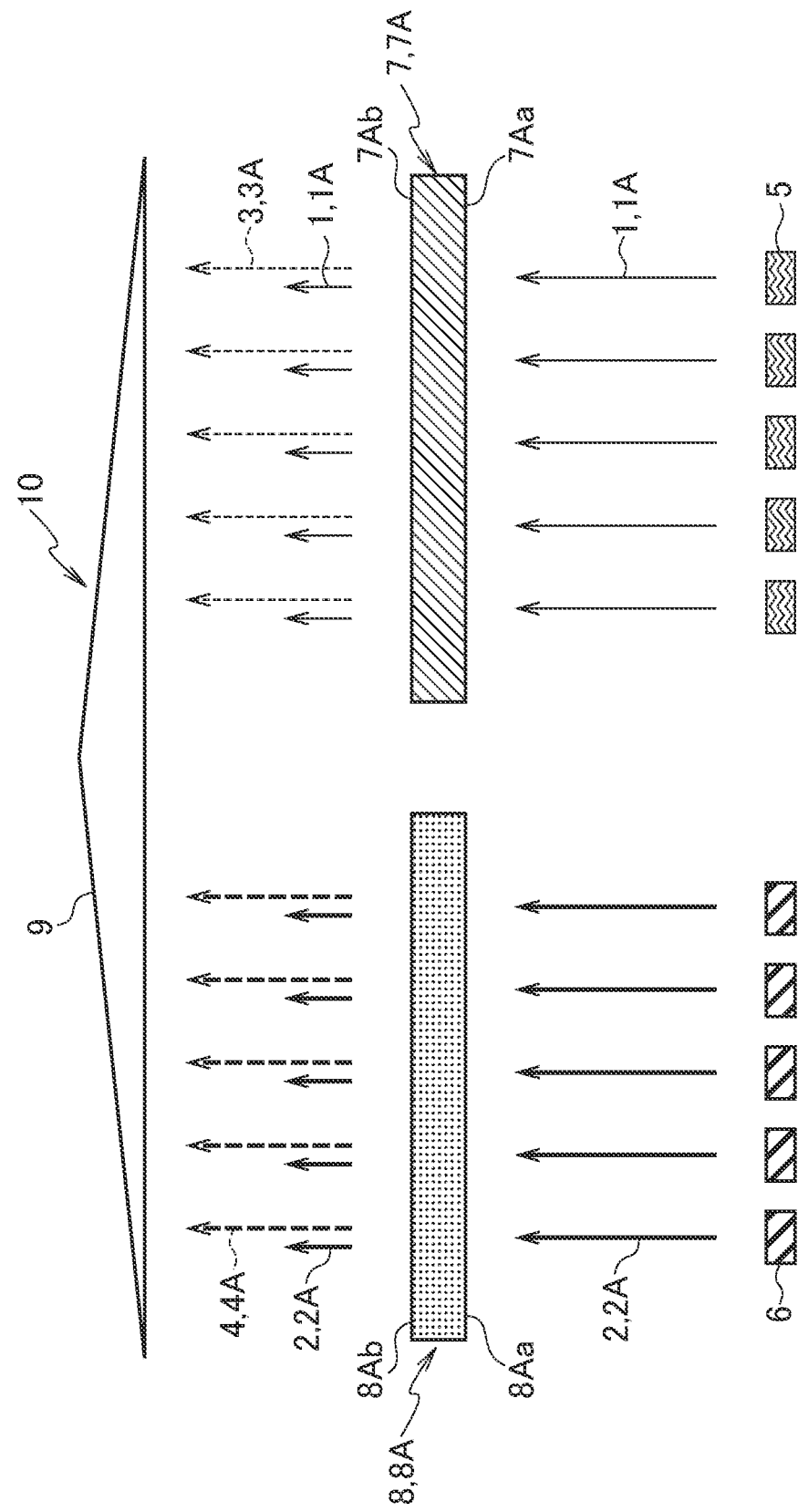
FIG. 6 is a schematic diagram illustrating another example of the configuration of the light emitting device according to the present embodiment.

As illustrated in FIG. 6, the light emitting device 10 may be configured to use the first light emitting element 5, the second light emitting element 6, the first wavelength converter 7A, and the second wavelength converter 8A, which are individually prepared in advance. In this case, the light emitting device 10 is configured so that the first primary light 1A is applied to only the first wavelength converter 7A, and that the second primary light 2A is applied to only the second wavelength converter 8A. Evan in such a way, the first light emitting element 5, the second light emitting element 6, the first wavelength converter 7A, and the second wavelength converter 8A, which are designed so as to emit lights different in color tone from one another, are procured in advance, whereby the color tone of the output light 9 can be controlled only by a combination of these. Accordingly, such a light emitting device advantageous for meeting a customer's demand is obtained.

As illustrated in FIGS. 3 to 6, the light emitting device 10 can be configured to be of a light transmission type of receiving the first primary light 1A and the second primary light 2A on front surfaces (7Aa, 8Aa) of the first wavelength converter 7A and the second wavelength converter 8A, and of radiating fluorescence from back surfaces (7Ab, 8Ab). Moreover, the light emitting device 10 can be configured to be of a reflection type of receiving the first primary light 1A and the second primary light 2A on the front surfaces (7Aa, 8Aa) of the first wavelength converter 7A and the second wavelength converter 8A, and of radiating fluorescence from the same front surfaces (7Aa, 8Aa).

As illustrated in FIGS. 3 to 5, the light emitting device 10 of the present embodiment can be configured so that a mixed light component of the first light component 1 and the third light component and a mixed light component of the second light component and the fourth light component are output from the same output surface. In such a way, the light component that does not include the near-infrared light and the light component that includes the near-infrared light are output from the same light output surface, and accordingly, such a light emitting device advantageous for miniaturization of a light output surface is obtained.

More specifically, in the light emitting device 10, both of the first primary light 1A emitted by the first light emitting element 5 and the second primary light 2A emitted by the second light emitting element 6 are applied to the first wavelength converter 7A or the second wavelength converter 8A. Moreover, as illustrated in FIGS. 3 to 5, the light emitting device 10 can be configured so that the mixed light component of the first light component 1 and the third light component and the mixed light component of the second light component and the fourth light component are output from the same output surface. Then, in order to adopt such a configuration, preferably, each of the first wavelength converter 7A and the second wavelength converter 8A has a structure having light transparency. That is, preferably, each of the first wavelength converter 7A and the second wavelength converter 8A has a structure in which both of the first primary light 1A and the second primary light 2A can transmit through the first wavelength converter 7A and/or the second wavelength converter 8A, and can be output together with the first wavelength-converted light 3A and the second wavelength-converted light 4A.

When the light emitting device 10 is configured as in FIGS. 3 to 5, the size of the light output surface that emits the output light 9 can be left within a range of an area of a larger one of the first wavelength converter 7A and the second wavelength converter 8A. Accordingly, such a light emitting device advantageous for miniaturization is obtained.

In the light emitting device 10 of FIG. 5, the first wavelength converter 7A is disposed close to the first light emitting element 5 and the second light emitting element 6, and the second wavelength converter 8A is disposed far therefrom. However, the second wavelength converter 8A may be disposed close to the first light emitting element 5 and the second light emitting element 6, and the first wavelength converter 7A may be disposed far therefrom.

As illustrated in FIGS. 2 and 6, the light emitting device 10 of the present embodiment can be configured to apply the first primary light 1A not to the second wavelength converter 8A but to the first wavelength converter 7A, and to output both of the first primary light 1A and the first wavelength-converted light 3A. Moreover, the light emitting device 10 of the present embodiment can be configured to apply the second primary light 2A not to the first wavelength converter 7A but to the second wavelength converter 8A, and to output both of the second primary light 2A and the second wavelength-converted light 4A. In this case, the mixed light component of the first light component 1 and the third light component 3 and the mixed light component of the second light component 2 and the fourth light component 4 will be output from output surfaces different from each other.

When the light emitting device 10 is configured as in FIGS. 2 and 6, the light emitting device 10 will include a light emitting surface, which radiates the fourth light component 4 that includes the near-infrared light component, and a light emitting surface, which radiates the visible light that does not include the near-infrared light component, independently of each other. Then, the light emitting device 10 will output the output light, which does not include the near-infrared light component, and the output light, which includes the near-infrared light component, separately from each other. Accordingly, these output lights can be controlled independently of each other, and further, according to the purpose, an intensity ratio of the near-infrared rays and the visible light and the color tone of the visible light can be controlled. Moreover, the near-infrared rays and the visible light can be output alternately with each other.

For example, a light emitting device that applies the near-infrared rays and the visible light alternately with each other can further suppress the interference between the reflected light of the near-infrared rays and the reflected light of the visible light in the detector. Accordingly, by using the above-described light emitting device, an electronic instrument that can obtain a signal with a good S/N ratio can be provided.

(Improvement Example of Light Emitting Device)

Next, regarding the light emitting device of the present embodiment, an improvement example for improving performance thereof will be described.

The light emitting device 10 of the present embodiment can increase an absolute number of photons, which constitute the output light 9, by such means for increasing the outputs of the first light emitting element 5 and the second light emitting element 6 or for increasing the number of light emitting elements. Thus, the light energy of the output light 9 emitted from the light emitting device 10 can be set to more than 3 W, preferably 10 W, more preferably 30 W. Moreover, the light energy of the light component with the wavelength of 700 nm or more in the output light 9 can also be set to more than 3 W. The light emitting device of such a high output-type is made, and can thereby illuminate the irradiated object with intense output light (for example, near-infrared light), and accordingly, can irradiate the irradiated object with relatively intense near-infrared rays even if a distance to the irradiated object is large. Moreover, even if the irradiated object is minute or thick, information regarding the irradiated object can be obtained.

In the light emitting device 10, preferably, photons converted into photons of the fourth light component 4 by the second phosphor 8 are supplied from a plurality of solid-state light emitting elements. Thus, the light emitting device 10 is configured to supply a lot of photons to the second phosphor 8, and accordingly, becomes advantageous for increasing the output of the near-infrared light component.

The light emitting device 10 can also increase a density of the photons, which are supplied to the phosphors, by such means of adopting light emitting elements such as laser diodes, which emit primary light with a high light density, for the first light emitting element 5 and the second light emitting element 6, or for condensing, by an optical lens, light emitted by the light emitting elements. For example, the light energy density of at least either the first primary light 1A or the second primary light 2A, and particularly, of the second primary light 2A can be set to more than 0.3 $W/mm^2$, preferably 1.0 $W/mm^2$, more preferably, 3.0 $W/mm^2$. In such a way, such a light emitting device that can emit the output light 9 with a large light energy density is obtained. Accordingly, for example, such a light emitting device that can perform point output of near-infrared light with a large light energy density is obtained.

When the light emitting elements which emit light with a high light density are used as the first light emitting element 5 and the second light emitting element 6, the light energy density of the primary light can be set to more than 0.3 $W/mm^2$, preferably 1.0 $W/mm^2$, more preferably 3.0 $W/mm^2$. In such a way, even if the light emitting device 10 is configured to apply the light-diffused primary light to the first wavelength converter 7A and the second wavelength converter 8A, the light emitting device 10 becomes such a light emitting device that emits the output light 9 that is relatively intense. Moreover, even if the light emitting device 10 is configured to apply the primary lights, which are not light diffused, to the first wavelength converter 7A and the second wavelength converter 8A, the light emitting device 10 becomes such a light emitting device that emits the output light 9 with a large light energy density. Accordingly, there can be provided a light emitting device that can apply near-infrared light to a large area while using light emitting elements with small light output surfaces, and a light emitting device that applies near-infrared light with a large light energy density while using the same.

Note that, by selecting appropriate light emitting elements, intensity of a light component with a wavelength shorter than 440 nm in the output light 9 can be adjusted to fall below 3% of the maximum fluorescence intensity value. Moreover, the intensity of the light component with the wavelength shorter than 440 nm in the output light 9 can also be adjusted to fall below 1% of the maximum fluorescence intensity value. In such a way, such output light is obtained, in which intensity of a light component in a wavelength region of ultraviolet to blue, where photoresist is easily sensitive to light, is nearly zero. Accordingly, such a light emitting device is obtained, which emits near-infrared light suitable for use in a yellow room and advantageous for use in semiconductor-related inspection work.

Moreover, in the light emitting device of the present embodiment, as mentioned above, preferably, the first light emitting element 5 and the second light emitting element 6 use light emitting diodes (LEDs) or laser diodes (LDs). However, any light emitting bodies may be used as the first light emitting element 5 and the second light emitting element 6 as long as the first light component 1 and the second light component 2 are emitted thereby, respectively.

The light emitting device of the present embodiment may further include a light distribution control mechanism that controls light distribution characteristics. With such a configuration, such a light emitting device capable of emitting output light having desired light distribution characteristics is obtained, for example, like an in-vehicle illuminating system of a variable light distribution type.

The light emitting device of the present embodiment may further include an output intensity variable mechanism such as an input electric power control device, for example, which changes the intensity of the near-infrared rays. With such a configuration, such a light emitting device advantageous for inspecting foods, drugs and the like, which are prone to be damaged by being irradiated with near-infrared rays, and so on is obtained.

The light emitting device of the present embodiment may further include a variable mechanism that changes a peak wavelength of a light component having a maximum fluorescence intensity value, for example, within the wavelength range of 700 nm or more and less than 2500 nm. With such a configuration, such a light emitting device is obtained, which has large versatility and can be easily used for a variety of purposes. Moreover, since a penetration depth of light into the inside of the irradiated object changes depending on the wavelength, such a light emitting device advantageous for inspection in the depth direction of the irradiated object, and the like is also obtained. Note that, as the variable mechanism of the fluorescence peak wavelength, which is as described above, for example, an optical filter such as a band-pass filter and a low-cut filter can be used.

Moreover, as a method for changing the peak wavelength, there is such a method as follows. First, the second wavelength converter 8A is caused to contain a plurality of the second phosphors 8 different in fluorescence spectrum shape and excitation spectrum shape. Then, any of the second phosphors 8 is excited by the first light emitting element 5 or the second light emitting element 6, which is controllable independently of each other, whereby the peak wavelength can be changed.

The light emitting device of the present embodiment may further include a light control mechanism that performs ON-OFF control for an output of at least a part of the output light. Even with such a configuration, such a light emitting device is obtained, which has large versatility and can be easily used for a variety of purposes.

The light emitting device of the present embodiment can form, into pulsed light, the visible light component with the wavelength of less than 700 nm and/or the light component with the wavelength of 700 nm or more in the output light. Particularly, the light emitting device can form, into the pulsed light, the light component with the wavelength of 700 nm or more in the output light. A full width at half maximum of an irradiation time of the pulsed light can be set to less than 300 ms. Moreover, the full width at half maximum can also be shortened as output intensity of the output light 9 or the fourth light component 4 is larger. Accordingly, according to the output intensity of the output light 9 or the fourth light component 4, the full width at half maximum can be set to less than 100 ms, less than 30 ms, less than 10 ms, less than 3 ms, or less than 1 ms. Note that a turn-off time of the pulsed light can be set to 1 ms or more and less than 10 s.

Herein, it is reported that a human eye feels light with a frequency of 50 to 100 Hz (cycle of 20 to 10 ms) as a flicker. Moreover, it is reported that birds such as pigeons feel light with a frequency of approximately 150 Hz (cycle of 6.7 ms) as a flicker, and that insects such as flies feel light with a frequency of approximately 300 Hz (cycle of 3.3 ms) as a flicker. Accordingly, a turn-off time of less than 30 ms at which these creatures do not feel the flicker is one preferable form.

Meanwhile, intense light application has a risk of doing damage to an object illuminated thereby, and accordingly, in a purpose in which it is not necessary to care about a flicker, 100 ms or more, and particularly 300 ms or more as a turn-off time of the pulsed light is a preferable form.

Note that, in the case of a beauty purpose of adjusting growth of human hair of the head and the body, preferably, the light energy of the output light is 0.01 J/cm$^2$ or more and less than 1 J/cm$^2$. Accordingly, when the light energy of the output light emitted from the light emitting device is set within this range, and the output light is applied to the vicinities of the hair roots, melanin and the like present inside the skin can be caused to absorb the light, and as a result, it becomes possible to adjust the growth of the hair.

Herein, a preferable 1/10 afterglow time of the output light, that is, a time until light intensity immediately before the output light is turned off decreases to 1/10 is preferably less than 100 is, more preferably less than 10 μs, particularly preferably less than 1 ρs. Thus, such a light emitting device capable of instantaneously turning on and instantaneously turning off is obtained.

The light emitting device of the present embodiment can also further include an ultraviolet light source that emits an ultraviolet ray having a maximum intensity value within a wavelength range of 120 nm or more and less than 380 nm, preferably 250 nm or more and less than 370 nm. In such a way, such a light emitting device that also has a bactericidal effect and the like by the ultraviolet ray is obtained.

The light emitting device of the present embodiment may further include a general illuminating device known heretofore. In such a way, an illuminating device given a function to output near-infrared light is obtained. Note that, as the illuminating device, usable is one composed by combining a solid-state light emitting element and a phosphor with each other. Specifically, mentioned is an illuminating device composed by combining a blue LED and a Ce$^{3+}$-activated garnet phosphor as a green or yellow phosphor with each other. Moreover, mentioned is an illuminating device composed by combining the blue LED, the Ce$^{3+}$-activated garnet phosphor as a green or yellow phosphor, and an Eu$^{2+}$-activated nitride phosphor or an Eu$^{2+}$-activated oxynitride phosphor as a red phosphor with one another.

Preferably, the light emitting device of the present embodiment is a medical light emitting device. That is, the light emitting device of the present embodiment, which is capable of emitting a near-infrared light component can be a light source or an illuminating device, which is for medical use or for biological technologies. Particularly, the light emitting device of the present embodiment can be a medical light emitting device for use in the fluorescence imaging method or the photodynamic therapy, or a light emitting device for biological technologies, which is for use in inspection and analysis of cells, genes, specimens and the like. The near-infrared light component has properties of transmitting through a living body, cells and the like, and accordingly, by such a light emitting device, enables observation and treatment of an affected area from the inside and outside of the living body, and enables use thereof for the biological technologies.

Moreover, the light emitting device of the present embodiment, which is capable of emitting a near-infrared light component, can also be a light source for a sensing system or an illuminating system for a sensing system. In such a way, for example, by using a near-infrared light component having properties of transmitting through organic matter and a near-infrared light component reflected by an object, a content or a foreign object in an organic matter-made bag or container can be inspected in an unopened state. Moreover, by such a light emitting device, animals including human beings, plants and objects can be monitored, and so on.

As described above, the light emitting device 10 of the present embodiment is a light emitting device that emits the output light 9. The light emitting device 10 includes: the first light emitting element 5 that emits the first light component 1; the second light emitting element 6 that is different from the first light emitting element 5 and emits the second light component 2; the first phosphor 7 that emits the third light component 3; and the second phosphor 8 that is different from the first phosphor 7 and emits the fourth light component 4. The output light 9 includes the first light component 1, the second light component 2, the third light component 3 and the fourth light component 4, which are different in color tone from one another. Each of the first light component 1 and the second light component 2 is a visible light component that has a maximum intensity value within the wavelength range of 380 nm or more and less than 700 nm. The third light component 3 is a visible light component that is derived from the first wavelength-converted light 3A emitted by the first phosphor 7 and has a maximum intensity value within the wavelength range of 435 nm or more and less than 700 nm. The fourth light component 4 is a near-infrared light component that is derived from the second wavelength-converted light 4A emitted by the second phosphor 8 and has a maximum intensity value within the wavelength range of 700 nm or more and less than 2500 nm. Then, the spectral distribution of the output light 9 has the trough portion T within the wavelength range of 650 nm or more and 750 nm or less, and the minimum intensity value within the wavelength range of 650 nm or more and 750 nm or less is less than 30% of the maximum intensity value within the wavelength range of 380 nm or more and 2500 nm or less.

In the light emitting device 10 of the present embodiment, the spectral distribution of the output light 9 has the trough portion T within the wavelength range of 650 nm to 750 nm, and the visible light component and the near-infrared light component are separated from each other at the trough portion T taken as a boundary. Accordingly, even if the light emitting device 10 is used in combination with a detector for near-infrared rays, it becomes possible to perform good inspection for an inspection object not only by the detector but also by visual observation.

[Electronic Instrument]

Figure 7:
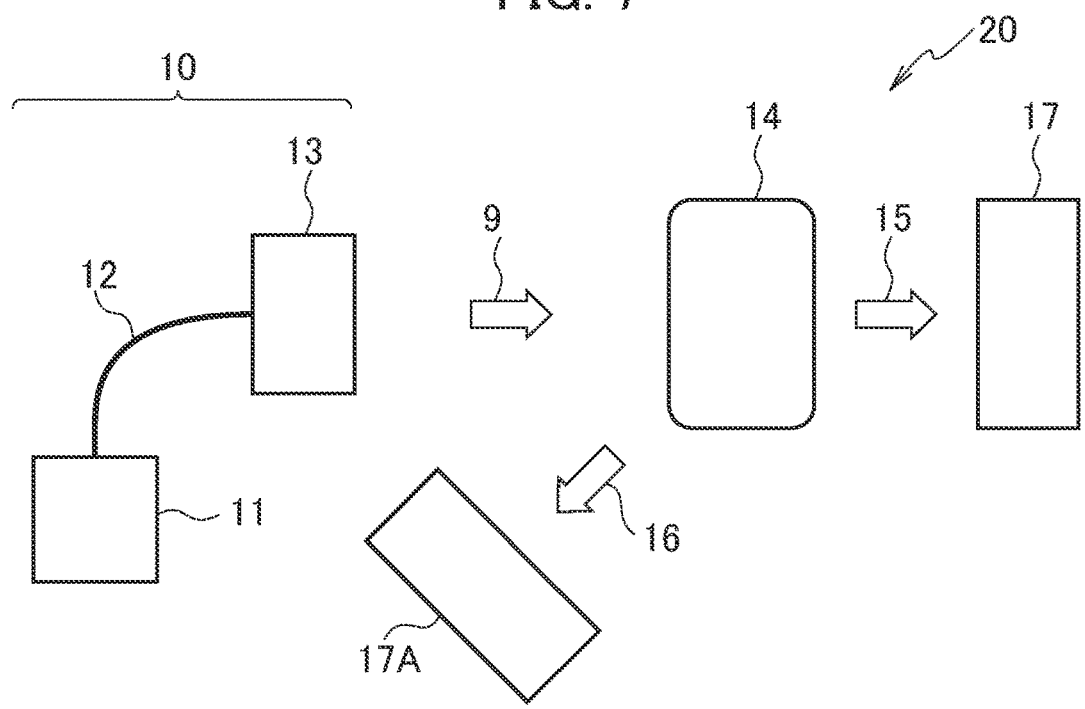
FIG. 7 is a schematic diagram illustrating an example of a configuration of an electronic instrument according to the present embodiment.

Next, a description will be given of an electronic instrument according to the present embodiment. The electronic instrument according to the present embodiment includes the above-mentioned light emitting device 10. FIG. 7 schematically illustrates an example of the electronic instrument according to the present embodiment.

In the electronic instrument 20, the light emitting device 10 include at least a power supply circuit 11, a conductor 12, and a light emitting unit 13. The power supply circuit 11 supplies electric power to the light emitting unit 13, and supplies electrical energy to the light emitting unit 13 through the conductor 12.

The light emitting unit 13 includes the first light emitting element 5, the second light emitting element 6, the first phosphor 7 and the second phosphor 8, which are mentioned above. Then, the light emitting unit 13 converts electrical energy into light energy. That is, the light emitting unit 13 converts at least a part of the electrical energy, which is supplied from the power supply circuit 11, into light energy that will become the output light 9, and then outputs the converted light energy.

The electronic instrument 20 further includes a first detector 17 and a second detector 17A. The first detector 17 senses a transmitted light component 15 of the output light 9 that is radiated from the light emitting device 10 and applied to an irradiated object 14. Specifically, the first detector 17 senses near-infrared light in the transmitted light component 15 that has transmitted through the irradiated object 14. The second detector 17A senses a reflected light component 16 in the output light 9 that is radiated from the light emitting device 10 and applied to the irradiated object 14. Specifically, the second detector 17A senses near-infrared light in the reflected light component 16 reflected by the irradiated object 14.

In the electronic instrument 20 having such a configuration, the irradiated object 14 is irradiated with the output light 9 including a near-infrared light component, and the transmitted light component 15 that has transmitted through the irradiated object 14 and the reflected light component 16 reflected by the irradiated object 14 are detected by the first detector 17 and the second detector 17A, respectively. Accordingly, the electronic instrument 20 enables detection of characteristic information of the irradiated object 14, in which the near-infrared light component gets involved.

Herein, the light emitting device of the present embodiment can emit the output light 9 that includes the visible light and the near-infrared light and is advantageous for both of the human eye and the detector. Accordingly, this light emitting device and the detector of the near-infrared rays are combined with each other, whereby such an electronic instrument suitable for industrial purpose is obtained.

Moreover, the light emitting device of the present embodiment can be configured so that the output light 9 has large energy and illuminates a wide range. Accordingly, even if the output light 9 is applied from a distance to the irradiated object 14, a signal having a good signal/noise ratio (S/N ratio) can be detected. Hence, such an electronic instrument is obtained, which is suitable for inspection of the irradiated object 14 that is large, batch inspection of objects distributed in a wide range, inspection of objects present in a part of a wide inspection area, inspection of distant persons and objects, and the like.

For reference, a size of the light emitting device of the present embodiment will be described. For example, an area of a main light extraction surface of the light emitting unit 13 can be set to 1 $cm^2$ or more and less than 1 $m^2$, preferably 10 $cm^2$ or more and less than 1000 $cm^2$. Moreover, a shortest distance from the light emitting unit 13 to the irradiated object 14 is, for example, 1 mm or more and less than 10 m. When it is necessary to apply intense near-infrared rays to the irradiated object 14, for example, in the case of medical inspection, beauty inspection, sensitive foreign object inspection, and the like, a shortest distance from the light emitting unit 13 to the irradiated object 14 can be set, for example, to 1 mm or more and less than 30 cm, preferably 3 mm or more and less than 10 cm. Moreover, when it is necessary to inspect the irradiated object 14 in a wide range, the shortest distance from the light emitting unit 13 to the irradiated object 14 can be set to 30 cm or more and less than 10 m, preferably 1 m or more and less than 5 m.

Note that, when it is necessary to apply intense near-infrared rays across a wide range, preferably, the light emitting unit 13 is configured to be movable, more preferably, the light emitting unit 13 is configured to be freely movable according to the form of the irradiated object. For example, the light emitting unit 13 can be structured to be capable of coming and going on a straight line or a curved line, structured to be capable of scanning the irradiated object in an XY-axis direction or XYZ-directions, and structured to be attached to a moving body (an automobile, a bicycle, a flying body such as a drone).

A variety of light detectors can be used as the first detector 17 and the second detector 17A. Specifically, according to a usage form of the electronic instrument, a quantum-type light detector that detects electric charges generated when light enters a PN junction of a semiconductor can be used. Examples of the light detector include a photodiode, a phototransistor, a photo IC, a CCD image sensor, and a CMOS image sensor. Moreover, as the light detector, there can also be used a thermal-type light detector that senses a change of electrical properties generated by a temperature rise due to generated heat when receiving light, an infrared film sensitive to light, or the like. Examples of the thermal-type light detector include a thermopile using a thermoelectric effect, and a pyroelectric element using a pyroelectric effect.

As the first detector 17 and the second detector 17A, single elements, each of which uses a photoelectric conversion element alone, may be used, or imaging elements, in each of which photoelectric conversion elements are integrated, may be used. A form of each of the imaging elements may be of a linear type in which the photoelectric conversion elements are arranged one-dimensionally, or may be of a surface type in which the photoelectric conversion elements are arranged two-dimensionally. As the first detector 17 and the second detector 17A, imaging cameras can also be used.

Note that, though the electronic instrument 20 of FIG. 7 includes both of the first detector 17 and the second detector 17A, this electronic instrument just needs to include at least either the first detector 17 or the second detector 17A.

Moreover, preferably, the electronic instrument of the present embodiment is an inspection device, a sensing device, a monitoring device or a classification device for the irradiated object. The near-infrared light component owned by the output light has properties of transmitting through most of substances. Accordingly, the electronic instrument is configured to apply the near-infrared light to the irradiated object from an outside thereof, and to detect transmitted light or reflected light thereof, and can thereby inspect, without destroying the irradiated object, a state of an inside thereof, whether or not there is a foreign object in the inside, and the like.

Moreover, the near-infrared light component is not visible to a human eye, and reflection characteristics thereof depend on substances. Accordingly, the electronic instrument is configured to apply the near-infrared light to the irradiated object, and to detect reflected light thereof, and can thereby sense the irradiated object even in darkness and the like without being perceived by persons.

Without destroying the irradiated object, the electronic instrument of the present embodiment can inspect a state of an inside thereof, whether or not there is a foreign object in the inside, and so on, can determine the quality of the irradiated object, and can sort acceptable and defective products. Accordingly, the electronic instrument further includes a mechanism of classifying such an irradiated object in a normal state and such an irradiated object in an abnormal state from each other, and is thereby enabled to classify such irradiated objects.

In the electronic instrument of the present embodiment, the light emitting device can be made not movable but fixed. In such a way, it is not necessary to provide a complicated mechanism for mechanically moving the light emitting device, and accordingly, such an electronic instrument less prone to failure is obtained. Moreover, the light emitting device is fixed indoors or outdoors, and can thereby performed fixed-point observation for a state of persons or objects and count the number of persons or objects at a predetermined place. Accordingly, such an electronic instrument is obtained, which is advantageous for collecting big data useful for discovering issues, utilizing the issues for business, and so on. Note that, as the fixed electronic instrument including the light emitting device, there can be mentioned store lighting, indoor lighting, a street light, and surgical illuminating device.

The electronic instrument of the present embodiment can also make the light emitting device movable and change the place to be irradiated therewith. For example, the light emitting device can be made movable by being attached to a moving stage or a moving body (a vehicle, a flying body or the like). In such a way, the light emitting device becomes able to irradiate a desired place or a wide range, and accordingly, such an electronic instrument advantageous for inspecting a large object, inspecting a state of an object located outdoors, and so on. Note that a drone can be mentioned as the movable electronic instrument including the light emitting device.

The electronic instrument of the present embodiment can be configured to include not only the light emitting device but also a hyperspectral camera as an imaging camera. Thus, this electronic instrument can perform hyperspectral imaging. The electronic instrument including the hyperspectral camera can identify, as an image, a difference unidentifiable by a naked eye or a normal camera, and accordingly, becomes an inspection device useful in a wide range of fields related to inspection, sorting and the like of products.

Figure 8:
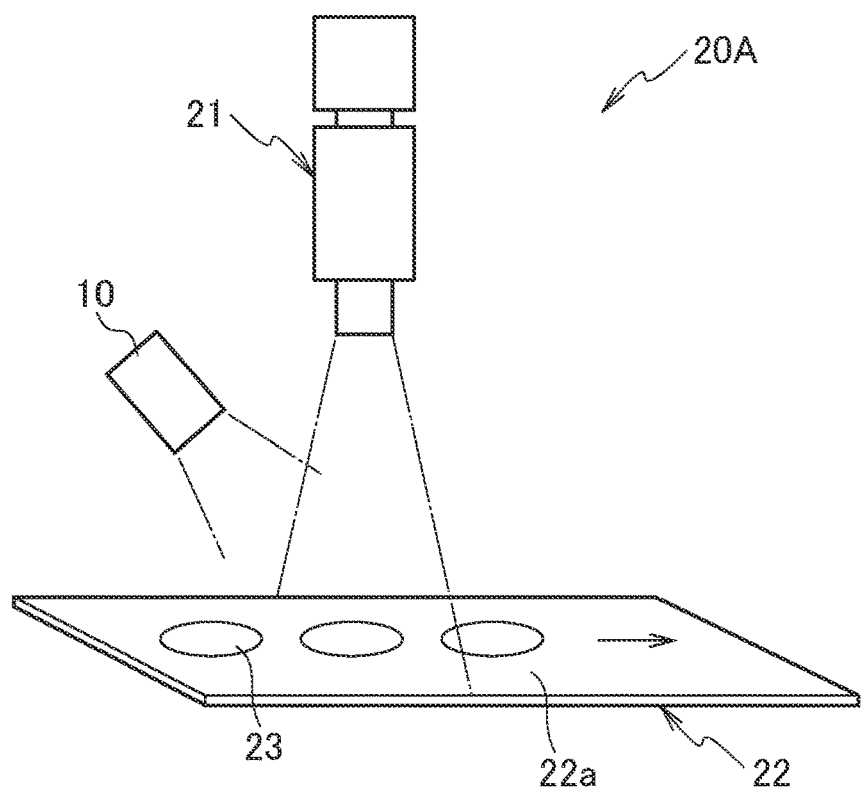
FIG. 8 is a schematic diagram illustrating another example of the configuration of the electronic instrument according to the present embodiment.

Specifically, as illustrated in FIG. 8, an electronic instrument 20A includes the light emitting device 10 and a hyperspectral camera 21. Then, while applying the output light 9 from the light emitting device 10 to irradiated objects 23 mounted on a front surface 22a of a conveyor 22, the electronic instrument 20A captures the irradiated objects 23 by the hyperspectral camera 21. Then, the electronic instrument 20A analyses obtained images of the irradiated objects 23, and can thereby inspect and sort the irradiated objects 23.

Preferably, the electronic instrument of the present embodiment includes not only the light emitting device but also a data processing system that does machine learning. Thus, the electronic instrument iteratively learns data captured to a computer, and becomes able to discover a pattern hidden therein. Moreover, the electronic instrument becomes able to apply newly captured data to that pattern. Accordingly, the electronic instrument becomes advantageous for automation and accuracy increase of inspection, sensing, monitoring and the like, and further, future prediction using big data, and the like.

The electronic instrument of the present embodiment can be used for medical treatment, veterinary treatment, biological technologies, agriculture, forestry and fisheries industries, livestock industries (meats, meat products, dairy products, and the like), or industries (foreign object inspection, content inspection, shape inspection, packaging condition inspection, and the like). Moreover, the electronic instrument can also be used for inspecting pharmaceuticals, animal experiments, foods, beverages, agriculture, forestry and fishery products, livestock products, and industrial products.

In other words, the electronic instrument of the present embodiment can be used for any of human bodies, plants and animals, and objects, and further, can also be used for gases, liquids, and solids.

Preferably, the electronic instrument of the present embodiment is any of a medical instrument, a therapeutic instrument, a beauty instrument, a health instrument, a nursing instrument, an analysis instrument, a measuring instrument and an evaluation instrument.

For example, in purposes of developing medical and biological technologies, the electronic instrument of the present embodiment can be used for inspecting, detecting, measuring, evaluating, analyzing, observing, monitoring, separating, diagnosing, treating, and purifying the following, which are: 1) blood, body fluid, components of these; 2) waste (urine, feces); 3) protein, amino acid; 4) cell (including cancer cell); 5) gene, chromosome, nucleic acid; 6) biological sample, bacterium, specimen, antibody; 7) biological tissue, organ, blood vessel; and 8) skin disease, alopecia.

Moreover, for example, in purposes of beauty and health care, the electronic instrument of the present embodiment can be used for inspecting, detecting, measuring, evaluating, analyzing, observing, monitoring, beautifying, sterilizing, growth-promoting, health promoting, and diagnosing the following, which are: 1) skin; 2) hair of head and body; 3) mouth inside, tooth inside, tooth periphery; 4) ear, nose; and 5) vital sign.

For example, in purposes of agriculture, forestry and fisheries industries, livestock industries, and industries, the electronic instrument of the present embodiment can be used for inspecting, detecting, measuring, evaluating, analyzing, observing monitoring, recognizing, sorting and separating the following, which are: 1) industrial products (including electronic members, electronic devices); 2) agricultural products (fruits and vegetables and the like); 3) enzymes, bacteria; 4) seafoods (fish, shellfish, crustacean, mollusc); 5) pharmaceuticals, biological specimens; 6) foods, beverages; 7) presence and state of person, animal, object; 8) state of gas (including water vapor); 9) liquid, fluid, water, moisture, humidity; 10) shape, color, internal structure, physical state of object; 11) space, position, distance; 12) contamination of object; 13) state of molecules, particle; and 14) industrial waste.

For example, in a nursing purpose, the electronic instrument of the present embodiment can be used for confirming excretion, and identifying, managing and monitoring a health state.

As described above, the electronic instrument of the present embodiment becomes able to meet every purpose including inspection, detection, measurement, evaluation, analysis, observation, monitoring, recognition, sorting, and separation.

Note that the present embodiment can also be regarded as a simple method invention of any of an inspection method, a sensing method, a monitoring method, a separation method, an analysis method, a measuring method, and an evaluation method, which use the light emitting device 10.

EXAMPLES

Hereinafter, the light emitting device of the present embodiment will be described more in detail by examples; however, the present embodiment is not limited to these examples.

First, the second wavelength converter 8A that emits the second wavelength-converted light 4A serving as an origin of the fourth light component 4 was fabricated. As the second wavelength converter 8A, formed was a resin fluorescent film including a phosphor composed mainly of a composite metal oxide activated by $Cr^{3+}$. Note that, as the composite metal oxide activated by $Cr^{3+}$, used was a $(Gd, La)_3Ga_2(GaO_4)_3:Cr^{3+}$ phosphor represented by a composition formula of $(Gd_{0.95}La_{0.05})_3(Ga_{0.97}Cr_{0.03})_2(GaO_4)_3$ and having a garnet-type crystal structure. Hereinafter, the $(Gd, La)_3Ga_2(GaO_4)_3:Cr^{3+}$ phosphor will also be referred to as a GLGG phosphor.

The GLGG phosphor was prepared by using the following compound powders as main raw materials and by a conventional solid phase reaction.

Gadolinium oxide ($Gd_2O_3$): purity 3N, made by Nippon Yttrium Co., Ltd.

Lanthanum hydroxide ($La(OH)_3$): purity 3N, made by Shin-Etsu Chemical Co., Ltd.

Gallium oxide ($Ga_2O_3$): purity 4N, made by Nippon Rare Metal, Inc.

Chromium oxide ($Cr_2O_3$): purity 3N, made by Kojundo Chemical Laboratory Co., Ltd.

Specifically, first, by a chemical reaction, the above-described raw materials were weighed so as to generate a compound with a stoichiometric composition, which is $(Gd_{0.95}La_{0.05})_3(Ga_{0.97}Cr_{0.03})_2(GaO_4)_3$. For reference, Table 1 shows weighed values in this case.

TABLE 1

| General formula | Raw material (g) | | | |
| --- | --- | --- | --- | --- |
|  | $Gd_2O_3$ | $La(OH)_3$ | $Ga_2O_3$ | $Cr_2O_3$ |
| $(Gd_{0.95}La_{0.05})_3(Ga_{0.97}Cr_{0.03})_2(GaO_4)_3$ | 10.213 | 0.563 | 9.154 | 0.090 |

Next, the weighed raw materials of 20 g were put into an alumina-made pot mill with a capacity of 250 ml, and further, alumina balls and ethanol of 60 ml were put thereinto. The alumina balls had a diameter φ of 3 mm, and were put by 200 g in total. Then, the pot mill was subjected to mixing at a rotation speed of 150 rpm for 30 minutes by using a planetary ball mill (made by Fritsch GmbH, Part No.: P-5).

Subsequently, the alumina balls were removed by using a sieve, and a slurry-like mixed raw material composed of the raw materials and ethanol was obtained. Thereafter, the slurry-like mixed raw material was fully dried at 125° C. by using a dryer. Then, the mixed raw material already dried was lightly mixed by using a mortar and a pestle, and was prepared as a raw material of the phosphor.

Next, such a phosphor raw material was put into an alumina-made firing vessel (material: SSA-H; size: B3; lidded), and was fired for 2 hours in the atmosphere of 1500° C. by using a box-type electric furnace. Note that a heating/cooling rate at the time of firing was set to 300° C./h.

A fired product thus obtained by manually disaggregated by using alumina-made mortar and pestle, and was thereafter passed through nylon mesh (mesh opening: 95 μm), whereby coarse particles were removed. Thus, a powdery GLGG phosphor represented by the composition formula of $(Gd_{0.95}La_{0.05})_3(Ga_{0.97}Cr_{0.03})_2(GaO_4)_3$ was obtained.

Although data is omitted, when a crystalline component of the obtained GLGG phosphor was evaluated by using an X-ray diffractometer (MiniFlex, a desktop X-ray diffractometer made by Rigaku Corporation), the crystalline component was a garnet compound having a substantially single crystalline phase. Moreover, when a particle shape and particle size of the crystalline component by using an electron microscope, a particle form thereof was a monodispersed particle form, the particle shape was a shape that could be regarded to be derived from garnet crystals, and the particle size was approximately 15 μm mostly. Note that, as the electron microscope, Miniscope (registered trademark)™4000, a desktop microscope made by Hitachi High-Tech Corporation, was used.

Moreover, fluorescence characteristics of the GLGG phosphor were evaluated under application conditions of blue light with the wavelength of 450 nm by using an absolute PL quantum yield measuring apparatus (C9920-02, made by Hamamatsu Photonics K.K.). As a result, a fluorescence peak wavelength was 747 nm, an internal quantum efficiency (IQE) was 92%, and a light absorption (Abs.) of the blue light was 57%. Moreover, as a result of evaluating the fluorescence characteristics of the GLGG phosphor under application conditions of red light with a wavelength of 628 nm, a fluorescence peak wavelength was 746 nm, an internal quantum efficiency (IQE) was 93%, and a light absorption (Abs.) of the red light was 45%.

Next, a resin fluorescent film was fabricated by using this GLGG phosphor. Specifically, the resin fluorescent film was obtained by curing phosphor paste obtained by mixing silicone resin and the GLGG phosphor with each other, followed by defoaming treatment. Note that, as the resin to be used as a sealing material of the phosphor powder, used was two-part addition curing silicone resin (product name KER-2500A/B, made by Shin-Etsu Chemical Co., Ltd.).

The above-described phosphor paste was prepared as follows. First, the silicone resin (agent A and agent B with the same amount) and the GLGG phosphor were weighed so that a filling rate of the phosphor powder in the resin was 30 vol %. Subsequently, the silicone resin and the phosphor powder were mixed with each other by using a mortar and a pestle. Then, a mixture thus obtained was evacuated (defoamed), whereby-phosphor paste was obtained.

Moreover, the above-described resin fluorescent film was formed as follows. First, onto a glass substrate, tapes with a thickness of 100 μm were pasted so as to make a pair, and to have an equal interval width of 15 mm. Subsequently, the phosphor paste was dropped to between the tapes which make a pair, and a surface thereof was smoothed by using a squeegee, and thereafter, the tapes were peeled off. Moreover, the phosphor paste was cured by being heated for two hours in the atmosphere of 150° C., whereby a phosphor sheet was obtained. Then, the obtained phosphor sheet was peeled off from the glass by using tweezers, and was cut to an appropriate size (10 mm square) by scissors. In such a way, a resin fluorescent film (second wavelength converter 8A having translucency) was obtained.

Note that, as the resin fluorescent film, three types of fluorescent films with different thicknesses (substantial thicknesses: 100 μm; 200 μm; 270 μm) were formed. These thicknesses were controlled by stacking, to two layers or three layers, the tapes pasted onto the glass substrate.

Fluorescence characteristics of the obtained resin fluorescent films were evaluated by using the above-described absolute PL quantum yield measuring apparatus. Table 2 shows evaluation results of the resin fluorescent films under excitation of blue light with the wavelength of 450 nm. Note that, in Table 2, IQE is an internal quantum efficiency, and Abs. is a light absorption. Moreover, EQE is an external quantum efficiency, and EQE can be calculated by a product of IQE and Abs. λp is a fluorescence peak wavelength of a fluorescence spectrum.

TABLE 2

| No. | Total thickness (μm) | IQE (%) | Abs. (%) | EQE (%) | λp (nm) | Thickness (μm) × number (sheets) of used fluorescent resin films |
|---|---|---|---|---|---|---|
| 1 | 100 | 91 | 41 | 37 | 732 | 100 × 1 |
| 2 | 198 | 91 | 54 | 49 | 732 | 198 × 1 |
| 3 | 265 | 90 | 57 | 51 | 733 | 265 × 1 |
| 4 | 300 | 90 | 58 | 52 | 730 | 100 × 3 |
| 5 | 400 | 89 | 59 | 52 | 730 | 100 × 4 |
| 6 | 500 | 87 | 60 | 52 | 733 | 100 × 5 |
| 7 | 530 | 90 | 62 | 56 | 733 | 265 × 2 |
| 8 | 795 | 86 | 63 | 54 | 734 | 265 × 3 |
| 9 | 1060 | 84 | 63 | 53 | 733 | 265 × 4 |
| 10 | 1325 | 83 | 63 | 52 | 734 | 265 × 5 |
| 11 | 1590 | 81 | 64 | 52 | 736 | 265 × 6 |

As shown in Table 2, samples No. 1 to No. 3 are results of evaluating each of the resin fluorescent films with substantial thicknesses of 100 μm, 200 μm and 270 μm alone. Moreover, samples No. 4 to No. 11 are results of evaluating those obtained by stacking, on one another, the resin fluorescent films with thicknesses and the number of sheets, which are shown in Table 2.

As seen from Table 2, such internal quantum efficiencies of the resin fluorescent films exceeded 80% regardless of the thicknesses thereof, and most of them were at an efficiency level of as high as 90% exceeding 85%. Moreover, the light absorptions tended to increase at the thicknesses increased, and to be saturated at a total thickness of 800 μm or more. Note that the light absorption was 41% when the total thickness was 100 μm, and was 64% when the total thickness was 1590 μm. The fluorescence peak wavelengths of the fluorescences emitted by the resin fluorescent films did not change largely depending on the total thicknesses, and were as constant as 730 nm to 736 nm.

Moreover, Table 3 shows evaluation results of the resin fluorescent films under excitation of red light with the wavelength of 628 nm.

TABLE 3

| No. | Total thickness (μm) | IQE (%) | Abs. (%) | EQE (%) | λp (nm) | Thickness (μm) × number (sheets) of used fluorescent resin films |
|---|---|---|---|---|---|---|
| 1 | 100 | 93 | 25 | 23 | 731 | 100 × 1 |
| 2 | 198 | 94 | 37 | 34 | 731 | 198 × 1 |
| 3 | 265 | 91 | 43 | 39 | 731 | 265 × 1 |
| 4 | 300 | 91 | 43 | 39 | 733 | 100 × 3 |
| 5 | 400 | 88 | 46 | 41 | 733 | 100 × 4 |
| 6 | 500 | 86 | 48 | 42 | 730 | 100 × 5 |
| 7 | 530 | 92 | 51 | 46 | 733 | 265 × 2 |
| 8 | 795 | 86 | 53 | 45 | 733 | 265 × 3 |
| 9 | 1060 | 85 | 53 | 45 | 733 | 265 × 4 |
| 10 | 1325 | 82 | 54 | 44 | 735 | 265 × 5 |
| 11 | 1590 | 80 | 54 | 43 | 738 | 265 × 6 |

As seen from Table 3, as in the case of the blue light excitation shown in Table 2, such internal quantum efficiencies of the resin fluorescent films exceeded 80% regardless of the thicknesses thereof, and most of them were at an efficiency level of as high as 90% exceeding 85%. Moreover, the light absorptions tended to increase as the thicknesses increased, and to be saturated at a total thickness of 800 μm or more. Note that the light absorption was 25% when the total thickness was 100 μm, and was 54% when the total thickness was 1590 μm. The fluorescence peak wavelengths of the fluorescences emitted by the resin fluorescent films did not change largely depending on the total thicknesses, and were as constant as 730 nm to 738 nm.

Next, light emitting devices were fabricated by using the resin fluorescent films whose fluorescence characteristics were shown in Table 2 and Table 3. Specifically, first, a commercially available white LED was prepared, which was composed by combining, with each other, a blue LED as the first light emitting element 5 that emits the first primary light 1A and a fluorescent film as the first wavelength converter 7A including the $Y_3Al_2(AlO_4)_3:Ce^{3+}$ phosphor with a fluorescence peak wavelength of 540 nm. Note that, for the commercially available white LED, used was one made by EK Japan Co., Ltd., in which a product name was Corded super bright LED (blue) and a part number was LK-5WH-C50. Moreover, the peak wavelength of the first primary light 1A (blue light) was 460 nm. Note that, hereinafter, the $Y_3Al_2(AlO_4)_3:Ce^{3+}$ phosphor will also be referred to as a YAG phosphor.

Moreover, as the second light emitting element 6, a commercially available red LED was prepared, which emits the second primary light 2A as red light (peak wavelength: 630 nm). Note that, as the commercially available red LED, used was one made by EK Japan Co., Ltd., in which a product name was Corded super bright LED (red) and a part number was LK-5RD-C50.

Figure 9:
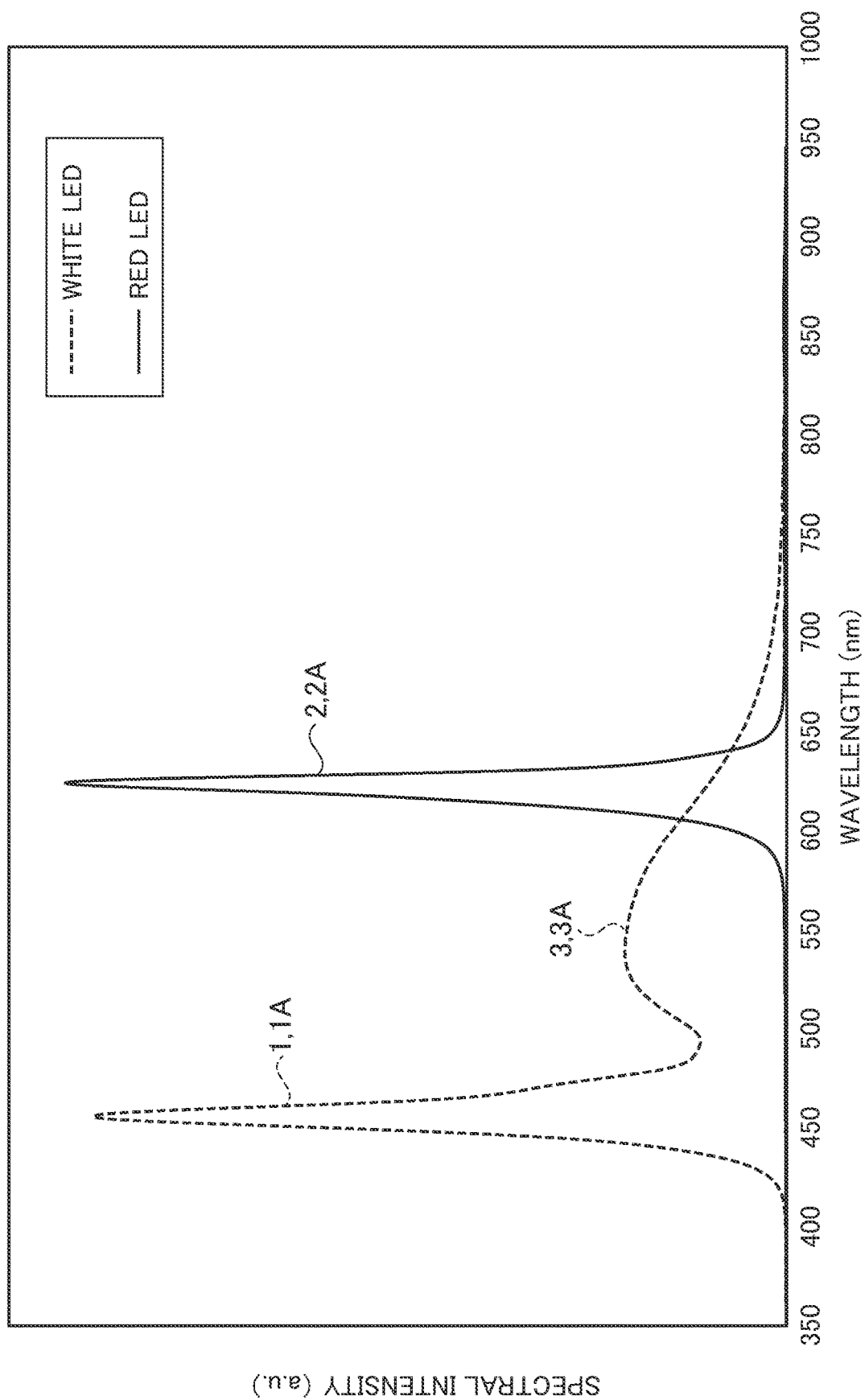
FIG. 9 is a graph illustrating a spectral distribution of a white LED used in Examples and a spectral distribution of a red LED used therein.

For reference, FIG. 9 shows a spectral distribution of the commercially available white LED and a spectral distribution of the commercially available red LED. Light emitted by the commercially available white LED was located at a position of (x,y)=(0.267,0.272) in the CIE chromaticity diagram, in which a correlated color temperature was 13514K, a duv was 0.2, an average color rendering index Ra was 82, and special color rendering index R9 was 21. Note that fluorescence intensity at a wavelength of 540 nm in the spectral distribution was 25% of fluorescence intensity thereof at a wavelength of 460 nm. Meanwhile, light emitted by the commercially available red LED was located at a position of (x,y)=(0.679,0.314) in the CIE chromaticity diagram.

Note that the spectral distribution of the white LED changes depending on the blue LED for use, the color tone (fluorescence peak wavelength) of the fluorescence emitted by the YAG phosphor, the light absorption of the first wavelength converter 7A including the YAG phosphor, and the like. Moreover, the light absorption of the first wavelength converter 7A changes depending on a volume ratio of the YAG phosphor in the first wavelength converter 7A, a thickness of the first wavelength converter 7A, and the like. Further, the light absorption of the first wavelength converter 7A also changes depending on a $Ce^{3+}$-activation volume of the YAG phosphor for use, a composition of the YAG phosphor (Gd substitution rate of Y, Lu substitution rate, Ga substitution rate of Al, and the like), a particle size (median particle size $D_{50}$) of the YAG phosphor. Then, as the white LED, besides the white LED used in this example, those which emit white lights with a variety of color tones are commercially available. Accordingly, by using an appropriate white LED, the color tone of the output light can be controlled, and so on.

Figure 10:
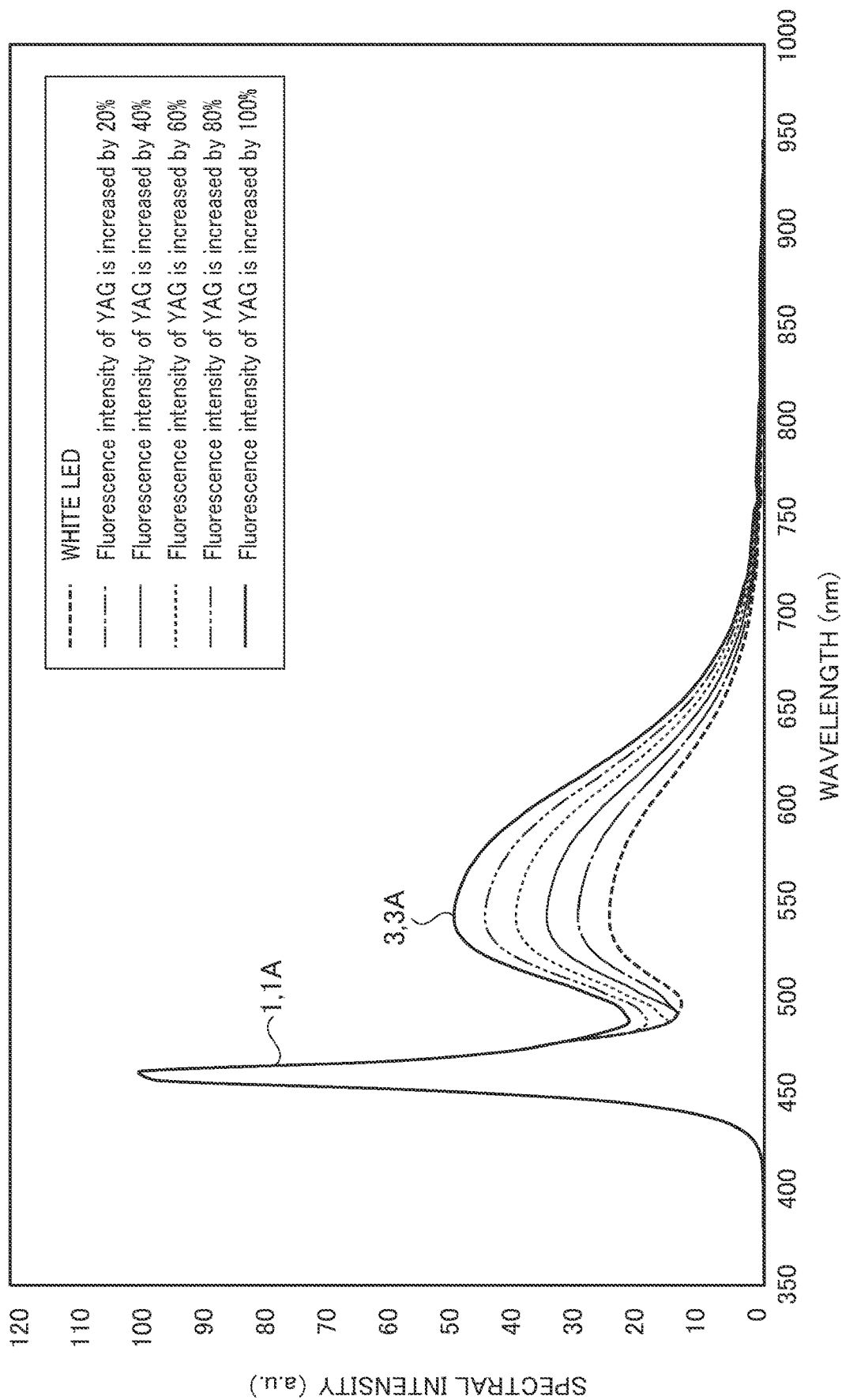
FIG. 10 is a graph illustrating examples of spectral distributions of white LEDs, each of which is capable of being fabricated by using a blue LED and a YAG phosphor.

For reference, FIG. 10 illustrates examples of spectral distributions of white LEDs, each of which is capable of being fabricated by using the blue LED (fluorescence peak: 460 nm) that includes the above-described white LED, and using the YAG phosphor (fluorescence peak: 540 nm). Incidentally, FIG. 10 is simulation results of spectral distributions in which the fluorescence intensity of the YAG phosphor in the spectral distribution of the above-described white LED was increased by 20%, 40%, 60%, 80% and 100% (doubled). Note that, as described above, such white LEDs which emit the white lights with the spectral distributions as described above can be obtained by technical means such as increasing the volume ratio of the YAG phosphor in the first wavelength converter 7A, and increasing the thickness of the first wavelength converter 7A. Table 4 shows characteristics of illumination light when the fluorescence intensity of the YAG phosphor was increased.

TABLE 4

| Fluorescence intensity of YAG | Correlated color temperature (K) | duv | Ra | R9 | x | y |
|---|---|---|---|---|---|---|
| Increased by 100% | 6311 | 17.7 | 75 | −37 | 0.313 | 0.359 |
| Increased by 80% | 6722 | 14.9 | 76 | −29 | 0.307 | 0.347 |
| Increased by 60% | 7212 | 11.7 | 77 | −21 | 0.299 | 0.332 |
| Increased by 40% | 8118 | 8.1 | 79 | −9 | 0.290 | 0.315 |
| Increased by 20% | 9740 | 4.3 | 81 | 5 | 0.280 | 0.295 |
| No increase (ref.) | 13514 | 0.2 | 82 | 21 | 0.267 | 0.272 |

Figure 11:
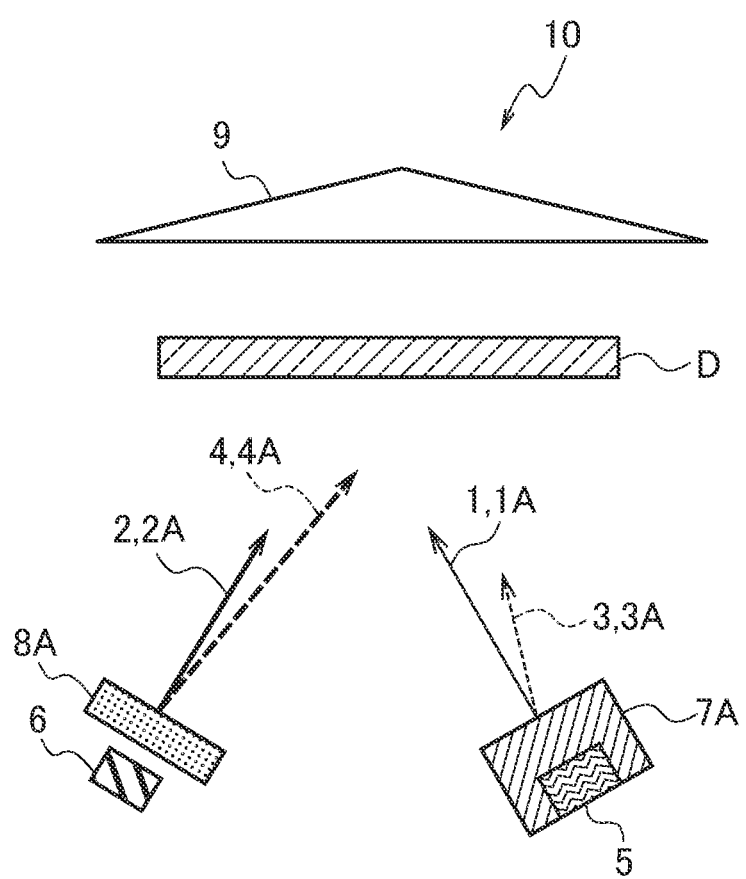
FIG. 11 is a schematic diagram illustrating a configuration of a light emitting device according to Examples.

Next, a light emitting device was fabricated as follows by using the white LED and the red LED, which are mentioned above. First, as illustrated in FIG. 11, the red LED (second light emitting element 6) was disposed in the vicinity of the white LED composed by disposing a YAG phosphor (first wavelength converter 7A) so as to cover a light output surface of the blue LED (first light emitting element 5). Moreover, immediately above a light output surface of the red LED, a resin fluorescent film (second wavelength converter 8A) composed by including the GLGG phosphor was disposed.

Note that, as the resin fluorescent film, the fluorescent film of No. 11 in which six resin fluorescent films with a thickness of 265 μm were stacked on one another was used in consideration of the output of the wavelength-converted light by the resin fluorescent film and the intensity ratio of the red light that transmits through the resin fluorescent film. Note that the red light absorption of the resin fluorescent films thus stacked is 54% as shown in Table 3. Accordingly, when one with a light absorption of 50% or more and less than 60% is used as the second wavelength converter 8A, a light emitting device that emits output light having a spectral distribution similar to that in this example can be designed.

Subsequently, in order that the white light emitted by the white LED, the red light emitted by the red LED, which has transmitted through the resin fluorescent film, and the near-infrared wavelength-converted light by the resin fluorescent film were condensed together, these components were arranged. Note that, in this example, light quality of the output light 9 was uniformed by using a ground glass-like light diffuser D.

With such a configuration, a first mixed light component was obtained, in which the blue light (first primary light 1A) emitted by the blue LED and the yellow green light component (first wavelength-converted light 3A) emitted by the YAG phosphor were mixed with each other. Further, a second mixed light component was obtained, in which the red light (second primary light 2A) emitted by the red LED and the near-infrared light component (second wavelength-converted light 4A) emitted by the GLGG phosphor were mixed with each other. Then, the light emitting device of this example outputs, as output light, mixed light of the first mixed light component and the second mixed light component.

Next, by using the obtained light emitting device, output lights, which are different from one another in terms of a ratio of the first mixed light component and the second mixed light component, were obtained. That is, a shortest distance from a light-irradiated surface illuminated with the output light of the light emitting device to a light output surface of the white LED and a shortest distance from this light-irradiated surface to a light output surface of the resin fluorescent film are adjusted, whereby there were obtained the output lights different from one another in terms of the ratio of the first mixed light component and the second mixed light component.

Specifically, in Example 1, the distance from the light-irradiated surface to the light output surface of the resin fluorescent film was constantly fixed, and the distance from the light-irradiated surface to the light output surface of the white LED was shortened. In Example 2, the distance from the light-irradiated surface to the light output surface of the resin fluorescent film was equalized to that in Example 1, and the distance from the light-irradiated surface to the light output surface of the white LED was lengthened more than that in Example 1. In Example 3, the distance from the light-irradiated surface to the light output surface of the resin fluorescent film was equalized to those in Example 1 and Example 2, and the distance from the light-irradiated surface to the light output surface of the white LED was lengthened more than that in Example 2. Note that, as the distance from the light-irradiated surface to the light output surface of the white LED is lengthened, the intensities of the first primary light 1A and the first wavelength-converted light 3A, which are included in the output light of the light emitting device, decrease.

Figure 12:
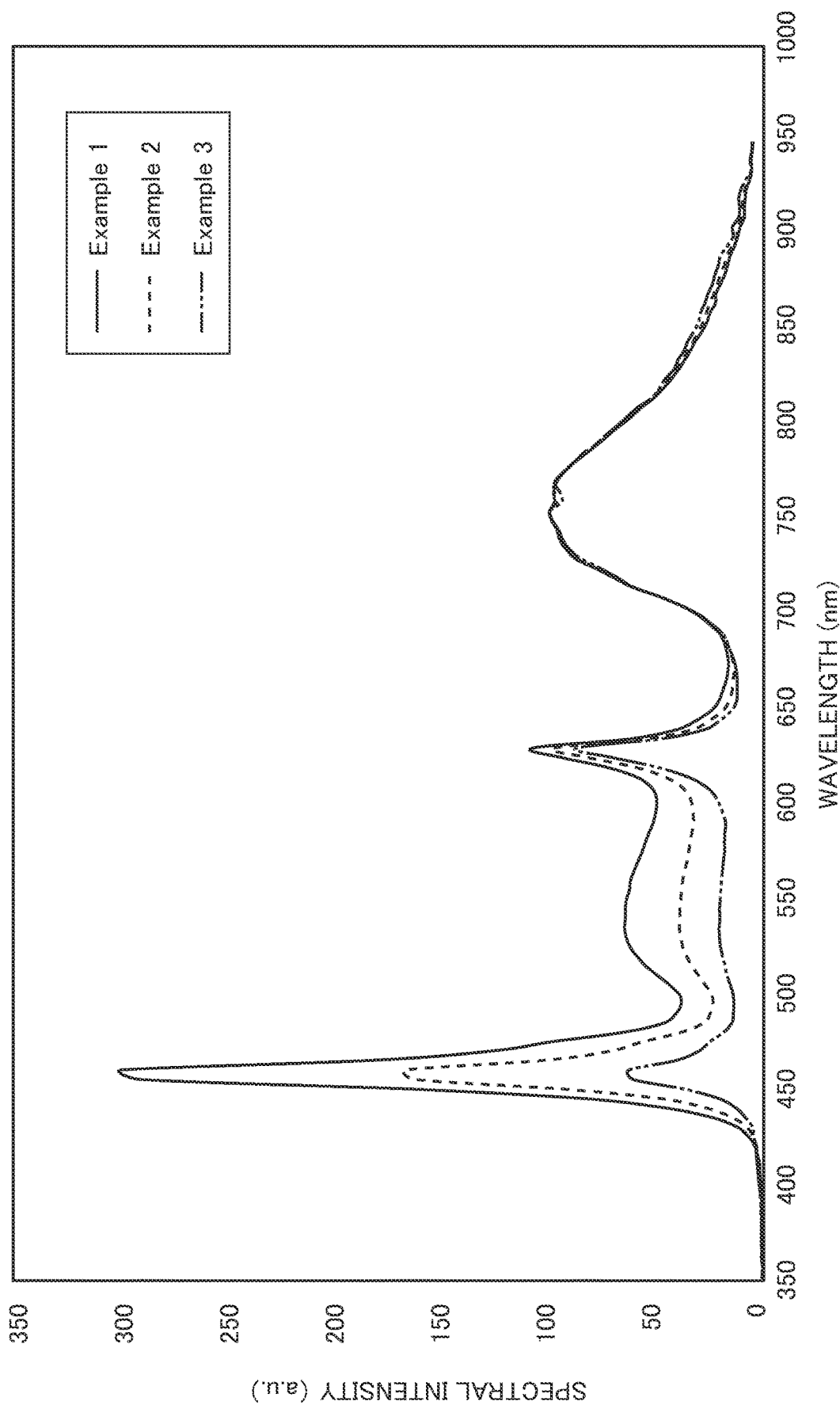
FIG. 12 is a graph illustrating spectral distribution of output light emitted from light emitting devices of Examples 1 to 3.

FIG. 12 illustrates spectral distributions of the output lights in Examples 1 to 3. As illustrated in FIG. 12, it is seen that the spectral distribution of the output light 9 has a trough portion within the wavelength range of 650 nm to 750 nm, and that the visible light component and the near-infrared light component are separated from each other at the trough portion taken as a boundary. Moreover, it is seen that the minimum intensity value within the wavelength range of 650 nm or more and 750 nm or less, that is, the intensity at around the wavelength of 675 nm is less than 30% of the maximum intensity value within the wavelength range of 380 nm or more and 2500 nm or less, that is, intensity at around a wavelength of 460 nm or around a wavelength of 755 nm.

Table 5 lists the correlated color temperature, the duv, the average color rendering index Ra and the special color rendering index R9 (numeric value serving as an index of color rendering properties of bright red) in each of the spectral distributions illustrated in FIG. 12.

TABLE 5

|  | Correlated color temperature (K) | duv | Ra | R9 |
|---|---|---|---|---|
| Example 1 | 12970 | −18.7 | 82 | 11 |
| Example 2 | 8137 | −28.7 | 73 | −40 |
| Example 3 | 3869 | −37.1 | 65 | −33 |

As shown in Table 5, it is seen that the output lights in Examples 1 to 3 have light colors suitable for use in general lighting, in which correlated color temperatures are 3800 or more and less than 13000, and have light colors in each of which a duv is within a range of ±40. Moreover, in each of the output lights in Examples 1 to 3, an average color rendering index was 60 or more and less than 85, and a special color rendering index R9 was −40 or more and less than 15. Note that, though data is omitted, the number of stacked resin fluorescent films in the light emitting device was changed, whereby such correlated color temperatures of the output light were able to be changed within a range of 1700K or more and less than 13000K, and particularly 2800 K or more and less than 13000K.

Note that, as seen from the spectral distributions in FIG. 9, a reason why results that the duv shifted to the negative side and Ra was left within the range of less than 85 were obtained in Examples 1 to 3 is that a ratio of the green light component in the white LED used in the example is small. Accordingly, these can be improved, for example, by using a white LED that emits white light, as illustrated in FIG. 10, having a spectral distribution with a large ratio of the green light component, and having 4, preferably more than 10 as a numeric value of the duv.

Herein, such a spectral distribution of the output light, which is obtained by adjusting the green light component, can be simulated with a relatively high accuracy by using the spectral distribution illustrated in FIG. 10 and the spectral distribution illustrated in FIG. 12. Moreover, the correlated color temperature, the duv, Ra and the like of the output light can also be calculated from these spectral distributions. Therefore, effects when the green light component included in the output light was adjusted were studied by simulation.

Figure 13:
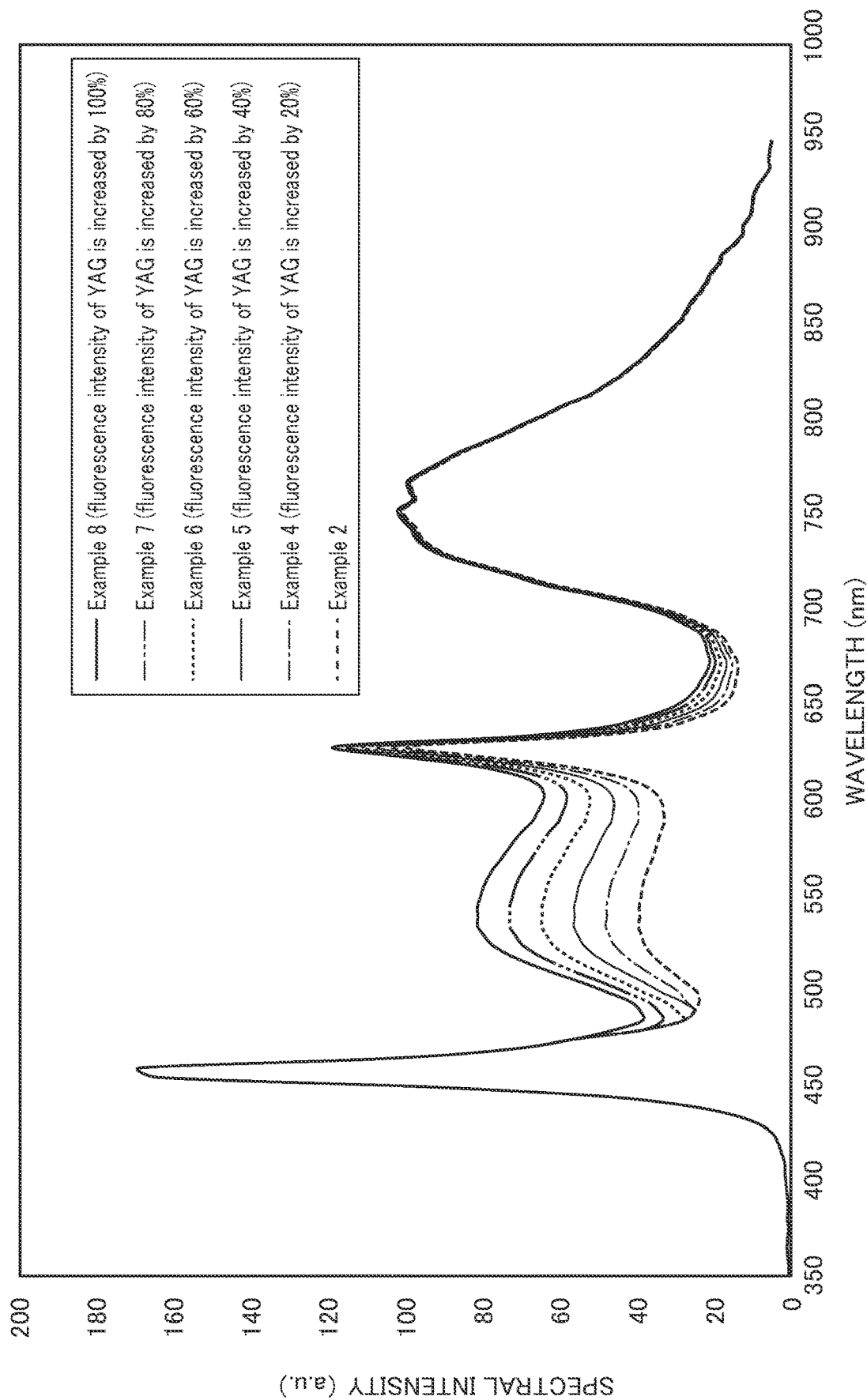
FIG. 13 is a graph illustrating spectral distributions obtained by adjusting a ratio of a green light component with respect to the spectral distribution of Example 2.

FIG. 13 illustrates results of simulating spectral distributions obtained by adjusting the ratio of the green light component based on data of Example 2 in FIG. 12. In Example 4, the fluorescence intensity of YAG was adjusted to be increased by 20% with respect to the data of Example 2. In Example 5, the fluorescence intensity of YAG was adjusted to be increased by 40% with respect to the data of Example 2. In Example 6, the fluorescence intensity of YAG was adjusted to be increased by 60% with respect to the data of Example 2. In Example 7, the fluorescence intensity of YAG was adjusted to be increased by 80% with respect to the data of Example 2. In Example 8, the fluorescence intensity of YAG was adjusted to be increased by 100% with respect to the data of Example 2.

For reference, Table 6 shows the correlated color temperature, the duv, the average color rendering index Ra and the special color rendering index R9 in each of the spectral distributions of Examples 4 to 8 illustrated in FIG. 13.

TABLE 6

|  | Correlated color temperature (K) | duv | Ra | R9 |
|---|---|---|---|---|
| Example 4 | 6821 | −20.2 | 82 | 11 |
| Example 5 | 6100 | −13.3 | 89 | 51 |
| Example 6 | 5713 | −7.2 | 94 | 80 |
| Example 7 | 5465 | −2 | 95 | 95 |
| Example 8 | 5308 | 2.4 | 93 | 78 |

As shown in Table 6, the ratio of the green light component was adjusted, whereby output light with a light color suitable for general lighting, in which a correlated color temperature was 5000 or more and less than 7000, was able to be obtained. Moreover, output light with a color tone close to natural light, in which a numeric value of a duv is within a range of ±21, preferably ±10, more preferably ±5, was able to be obtained. Further, output light with high color rendering properties, in which an average color rendering index is 82 or more and less than 96 was able to be obtained. In addition, output light with an average color rendering index exceeding 85 and output light with an average color rendering index exceeding 90 were also able to be obtained. Moreover, output light with a special color rendering index R9 of 10 or more was able to be obtained. In particular, output light with a special color rendering index R9 of 50 or more and less than 96 is suitable for a purpose of emphasizing reddishness at the time of being applied to an object having such reddishness.

As described above, in each of Examples 4 to 8, the white LED used in Example 2 was replaced by a white LED that emits white light with a correlated color temperature of less than 10000K and a numeric value of a duv exceeding 4. As a result, it has been seen that a light emitting device can be provided, which simultaneously emits white light with high color rendering properties in which a numeric value of Ra is 80 or more and a relatively high-output near-infrared light component. Moreover, it has been seen that a light emitting device can be provided, which simultaneously emits a near-infrared light component and white lights with high red color rendering properties in which a numeric value of R9 exceeds 10 and white light with light quality close to natural light in which a numeric value of a duv is ±21.

Note that, as mentioned above, in the light emitting device of this example, the shortest distance from the light-irradiated surface to the light output surface of the white LED and the shortest distance from the light-irradiated surface to the light output surface of the resin fluorescent film are adjusted, whereby there are obtained the output lights different from one another in terms of the ratio of the first mixed light component and the second mixed light component. Accordingly, this light emitting device can also be regarded as a light emitting device including: color tone adjusting means for adjusting output ratios of a plurality of types of primary light (first light component and second light component); and/or color tone adjusting means for adjusting output ratios of a plurality of types of wavelength-converted light (third light component and fourth light component).

Note that, in this example, the description has been given of the case of using, as the second wavelength converter 8A, the resin fluorescent film composed by including the GLGG phosphor. However, in order to increase the output, an inorganic sealing fluorescent film or fluorescent ceramics can be used in place of the resin fluorescent film. For example, the fluorescent ceramics can be prepared by applying manufacturing technologies of translucent YAG fluorescent ceramics and a translucent alumina light emitting tube.

Moreover, though data is omitted, it has been confirmed that, for example, when 24.7 W blue light is applied to the GLGG phosphor (thickness: 530 μm) made of fluorescent ceramics, wavelength-converted light of 11.1 W, in which a fluorescence peak is 755 nm, is emitted. At this time, the blue light is obtained by a high output-type blue LED module (fluorescence peak wavelength: 459 nm; drive DC: 30-40 V, 3000 mA) composed by packaging 100 pieces of 0.25 W blue LED chips (0.8 mm square) on a substrate with a square of 20 cm. Moreover, it has been confirmed that, even if 14.3 W red light emitted by a high output-type red LED module (fluorescence peak wavelength: 664 nm; drive DC: 30-40 V, 3000 mA) with equivalent specifications is applied to the same fluorescent ceramics, wavelength-converted light with light energy of approximately 80% thereof is emitted.

Accordingly, in accordance with the present embodiment, a light emitting device can be obtained, which emits not only a near-infrared light component with light energy exceeding 3 W, but also a high-output near-infrared light component with light energy exceeding 10 W. The light emitting device of such a high output-type can illuminate an object with intense near-infrared rays, and accordingly, can irradiate such an illumination object with relatively intense near-infrared rays even if a distance to the illumination object is large.

Note that, for example, the fluorescent ceramics composed of the GLGG phosphor can be obtained as follows. First, 19 g of the phosphor material composed of the raw materials shown in Table 1 is loaded into a mold (diameter φ: 50 mm), and is press-molded by a pressure of approximately 190 MPa, and a molded body of the phosphor raw material is formed. The molded body of the phosphor raw material is disc-shaped, in which a diameter φ is 50 mm and a height is 3.1 mm. Subsequently, this molded body is mounted on an alumina plate (length: 60 mm; width: 100 mm; and thickness: 1.5 mm) placed on an alumina-made large firing boat (material: SSA-S), and is fired for 2 hours in a nitrogen atmosphere of 1500 to 1600° C. by using a tubular atmosphere furnace. Note that a heating/cooling rate at the time of firing is set to 300° C./h. Thus, a disc-shaped sintered body is obtained. A top surface and bottom surface of this sintered body are mechanically polished by a polisher to set the sintered body to a predetermined thickness, whereby the fluorescent ceramics composed of the GLGG phosphor is obtained.

Although the present embodiment has been described above, the present embodiment is not limited to these, and various modifications are possible within the scope of the spirit of the present embodiment.

The entire contents of Japanese Patent Application No. 2020-084496 (filed on: May 13, 2020) and Japanese Patent Application No. 2021-014818 (filed on: Feb. 2, 2021) are incorporated herein by reference.

INDUSTRIAL APPLICABILITY

In accordance with the present disclosure, a light emitting device can be provided, which emits output light enabling good inspection for an inspection object not only by using a detector of near-infrared rays but also by visual observation in the case of being used in combination with the detector, and to provide an electronic instrument that uses the light emitting device.

REFERENCE SIGNS LIST

1 First light component
1A First primary light
2 Second light component
2A Second primary light
3 Third light component
3A First wavelength-converted light
4 Fourth light component
4A Second wavelength-converted light
5 First light emitting element
6 Second light emitting element
7 First phosphor
7A First wavelength converter
8 Second phosphor
8A Second wavelength converter
9 Output light
10 Light emitting device
20, 20A Electronic instrument
T Trough portion

The invention claimed is:

1. A light emitting device configured to emit output light, comprising:
   a first light emitting element configured to emit a first light component;
   a second light emitting element that is different from the first light emitting element and configured to emit a second light component;
   a first phosphor configured to emit a third light component; and
   a second phosphor that is different from the first phosphor and configured to emit a fourth light component, wherein
   the output light includes the first light component, the second light component, the third light component and the fourth light component, which are different in color tone from one another,
   each of the first light component and the second light component is a visible light component that has a maximum intensity value within a wavelength range of 380 nm or more and less than 700 nm,
   the third light component is a visible light component that is derived from first wavelength-converted light emitted by the first phosphor and has a maximum intensity value within a wavelength range of 435 nm or more and less than 700 nm,
   the fourth light component is a near-infrared light component that is derived from second wavelength-converted light emitted by the second phosphor and has a maximum intensity value within a wavelength range of 700 nm or more and less than 2500 nm, and
   a spectral distribution of the output light has a trough portion within a wavelength range of 650 nm or more and 750 nm or less, and a minimum intensity value within the wavelength range of 650 nm or more and 750 nm or less is less than 30% of a maximum intensity value within a wavelength range of 380 nm or more and 2500 nm or less.

2. The light emitting device according to claim 1, wherein,
   the first light component is a light component that is derived from first primary light emitted by the first light emitting element and has a maximum intensity value within a wavelength range of 435 nm or more and less than 480 nm,
   the second light component is a light component that is derived from second primary light emitted by the second light emitting element and has a maximum intensity value within a wavelength range of 600 nm or more and less than 680 nm, and
   the third light component is a light component that has a maximum intensity value within a wavelength range of 500 nm or more and less than 600 nm.

3. The light emitting device according to claim 1, wherein the fourth light component is light obtained by wavelength-converting the second light component by the second phosphor.

4. The light emitting device according to claim 1, wherein the third light component is light obtained by wavelength-converting the first light component by the first phosphor.

5. The light emitting device according to claim 1, wherein the output light exhibits white color.

6. The light emitting device according to claim 5, wherein an average color rendering index Ra of the output light exceeds 80.

7. The light emitting device according to claim 1, wherein a mixed light component of the first light component and the third light component and a mixed light component of the second light component and the fourth light component are output from output surfaces different from each other.

8. The light emitting device according to claim 1, wherein a mixed light component of the first light component and the third light component and a mixed light component of the second light component and the fourth light component are output from a same output surface.

9. The light emitting device according to claim 1, wherein light energy of a light component with a wavelength of 700 nm or more in the output light exceeds 3 W.

10. The light emitting device according to claim 1, wherein photons converted into photons of the fourth light component by the second phosphor are supplied from a plurality of solid-state light emitting element.

11. The light emitting device according to claim 1, wherein a wavelength converter including the second phosphor allows transmission of the fourth light component.

12. The light emitting device according to claim 1, wherein the second phosphor includes $Cr^{3+}$ as fluorescent ions.

13. An electronic instrument comprising the light emitting device according to claim 1.